United States Patent
Wang

(10) Patent No.: US 6,958,513 B2
(45) Date of Patent: Oct. 25, 2005

(54) FLOATING-GATE MEMORY CELL HAVING TRENCH STRUCTURE WITH BALLISTIC-CHARGE INJECTOR, AND THE ARRAY OF MEMORY CELLS

(76) Inventor: Chih-Hsin Wang, 6585 Gillis Dr., San Jose, CA (US) 95120

( * ) Notice: Subject to any disclaimer, the term of this patent is extended or adjusted under 35 U.S.C. 154(b) by 81 days.

(21) Appl. No.: 10/457,249

(22) Filed: Jun. 6, 2003

(65) Prior Publication Data

US 2004/0248371 A1 Dec. 9, 2004

(51) Int. Cl.[7] .............................................. H01L 31/062
(52) U.S. Cl. ........................ 257/330; 257/328; 438/270
(58) Field of Search ................................ 257/328–330; 438/270

(56) References Cited

U.S. PATENT DOCUMENTS

| | | | |
|---|---|---|---|
| 4,957,877 A | 9/1990 | Tam et al. | |
| 5,146,426 A | 9/1992 | Mukherjee et al. | |
| 5,432,739 A | 7/1995 | Pein | |
| 5,563,083 A | 10/1996 | Pein | |
| 5,780,341 A | 7/1998 | Ogura | |
| 6,372,617 B1 | 4/2002 | Kitamura | |
| 6,479,863 B2 | 11/2002 | Caywood | |
| 6,621,107 B2 * | 9/2003 | Blanchard et al. | 257/155 |
| 2004/0021170 A1 | 2/2004 | Caywood | |

OTHER PUBLICATIONS

Kitamura T. et al., "A Low Voltage Operating Flash Cell with High Coupling Ratio Using Horned Floating gate with Fine HSG", Symposium on VLSI Tech Digest, p. 104, 1998.
Lai, "Flash Memories: Where We Were and Where We Are Going", IEDM Technical Digest, pp. 971–973, 1998.
Kuo et al., "TEFET—A High Density, Low Erase Voltage, Trench Flash EEPROM", Symposium on VLSI Tech Digest, p. 51, 1994.
H. Pein et al, "Performance of the 3–D Sidewall Flash EPROM Cell", IEDM Tehnical Digest, pp. 11–14, 1993.

* cited by examiner

Primary Examiner—Dung A. Le

(57) ABSTRACT

A method of forming an array of floating gate memory cells, and an array formed thereby, wherein each memory cell includes an electrical conductive floating gate formed in a trench in a semiconductor substrate, and an electrical conductive control gate having a portion disposed over and insulated from the floating gate. An electrical conductive tunneling gate is disposed over and insulated from the control gate by an insulating layer to form a tri-layer structure permitting both electron and hole charges tunneling through at similar tunneling rate. Spaced apart source and drain regions are formed with the source region disposed adjacent to and insulated from a lower portion of the floating gate, and with the drain region disposed adjacent to and insulated from an upper portion of the floating gate with a channel region formed therebetween and along a sidewall of the trench.

64 Claims, 19 Drawing Sheets

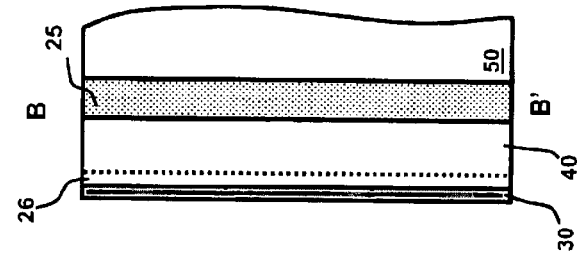
FIG. 7A
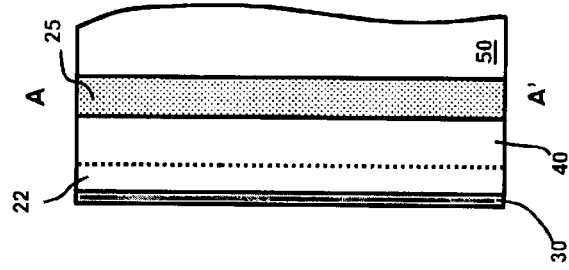
FIG. 8A
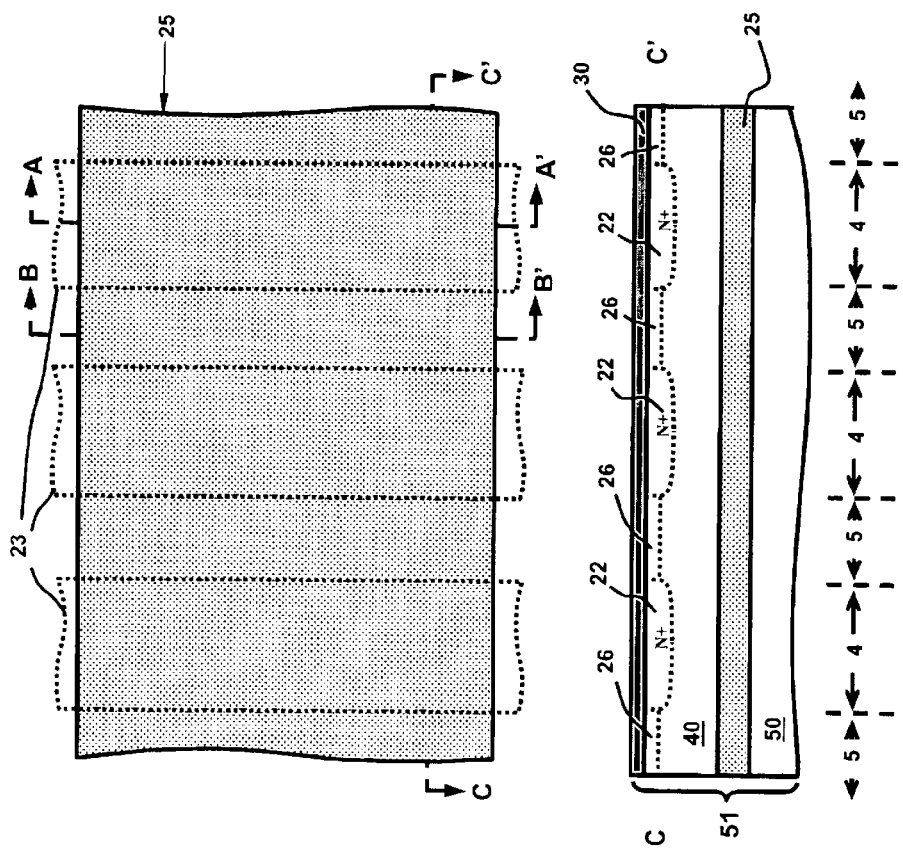
FIG. 6A
FIG. 9A

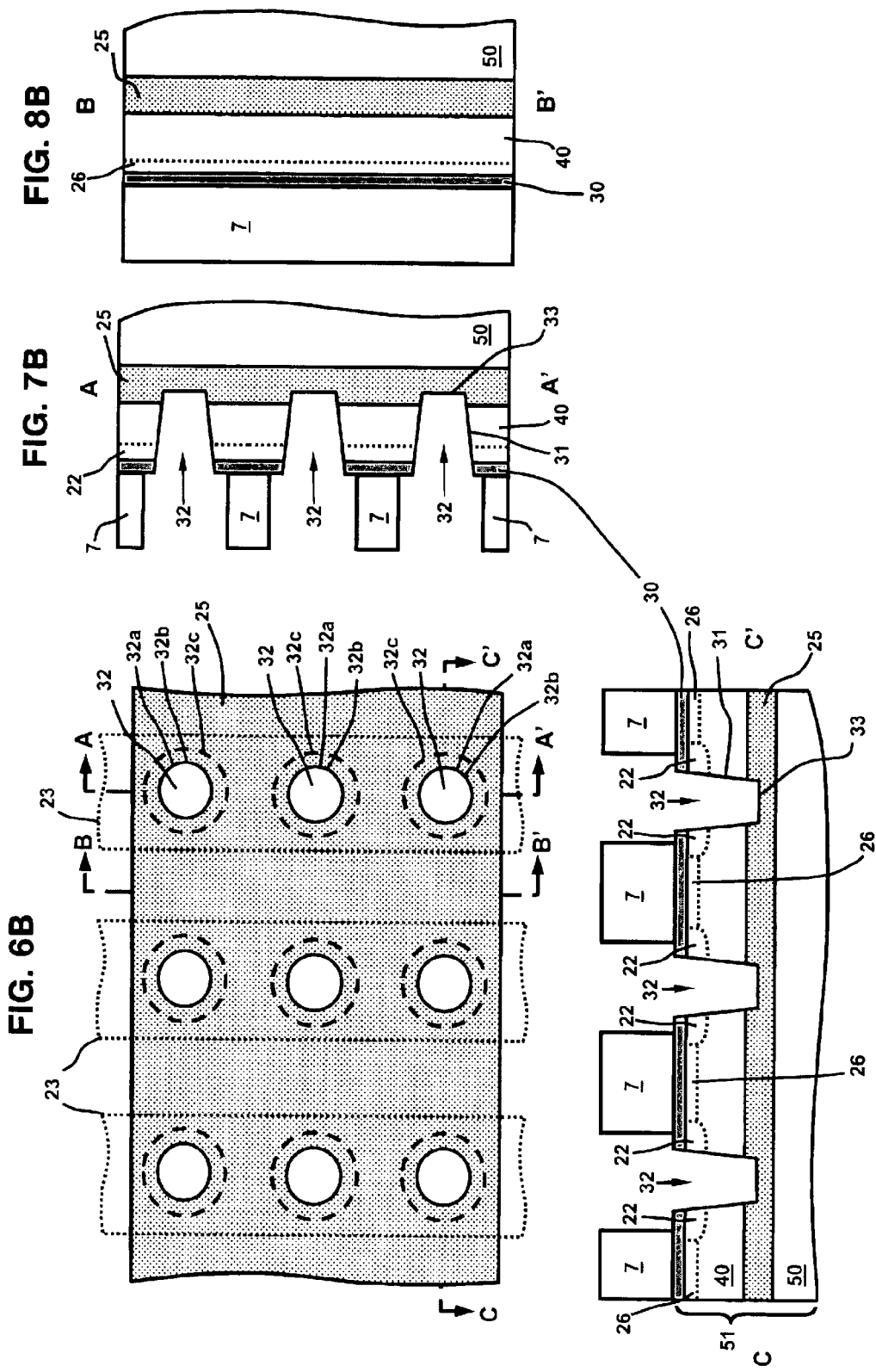

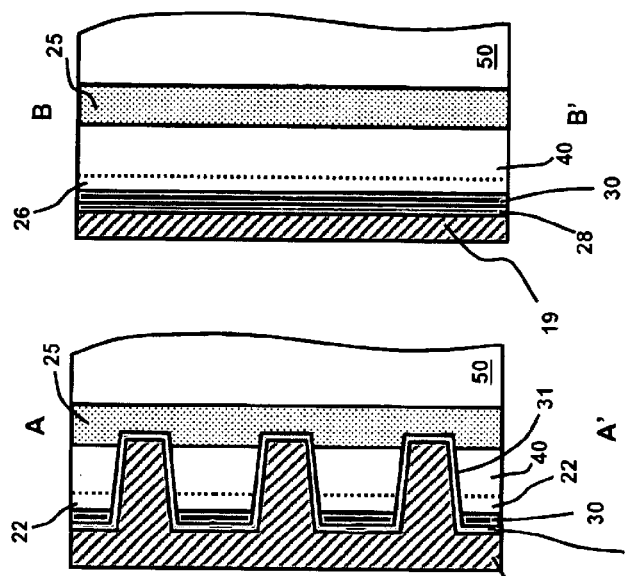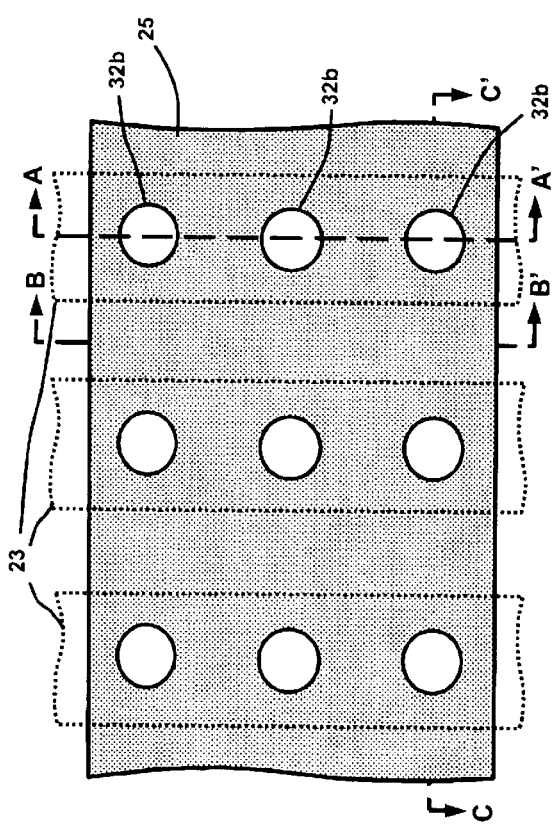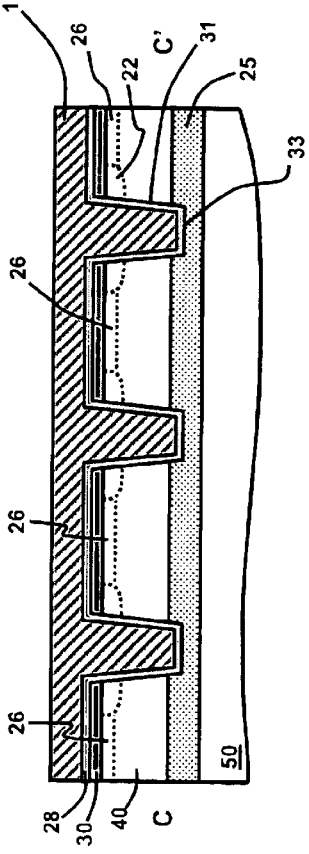

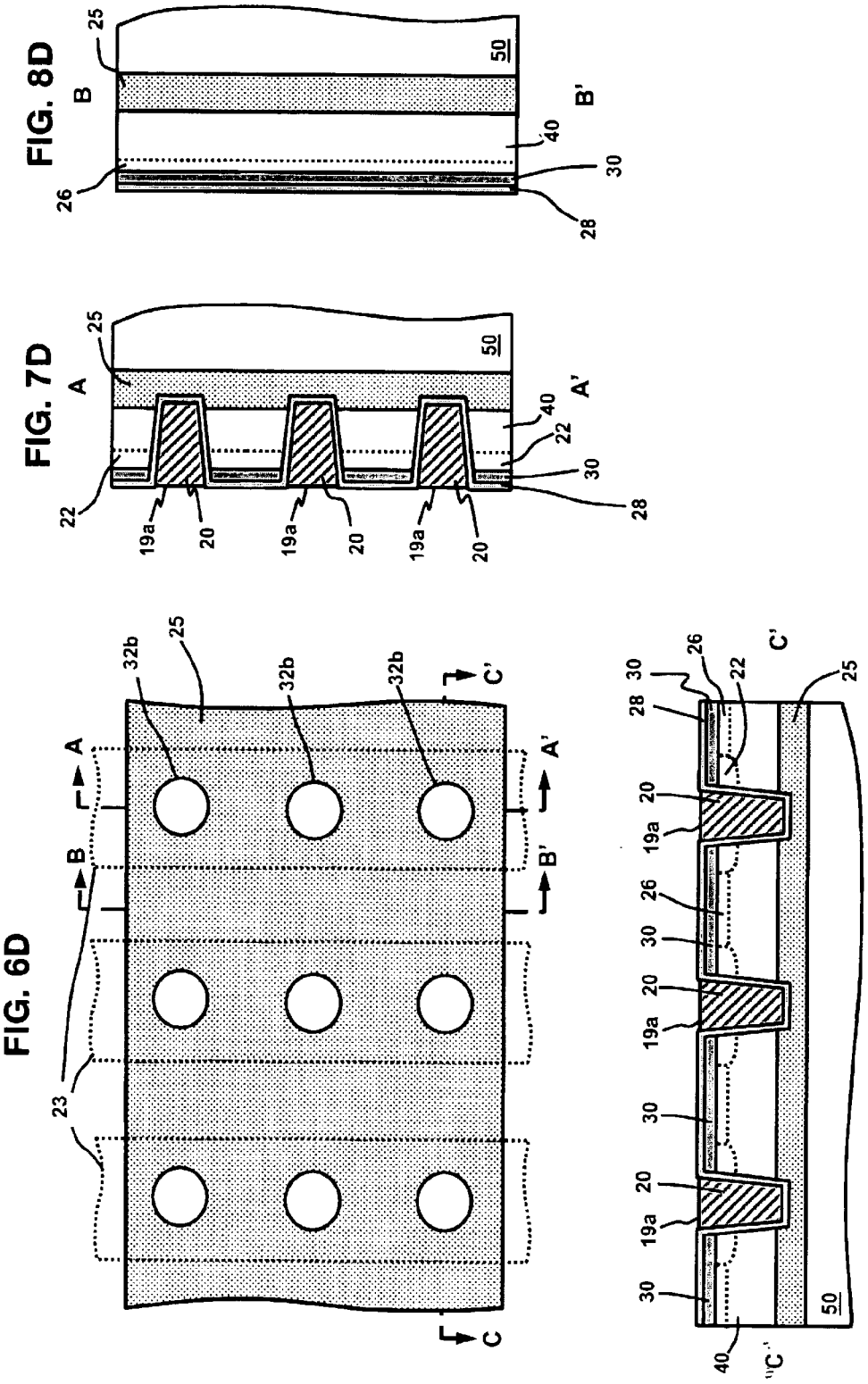

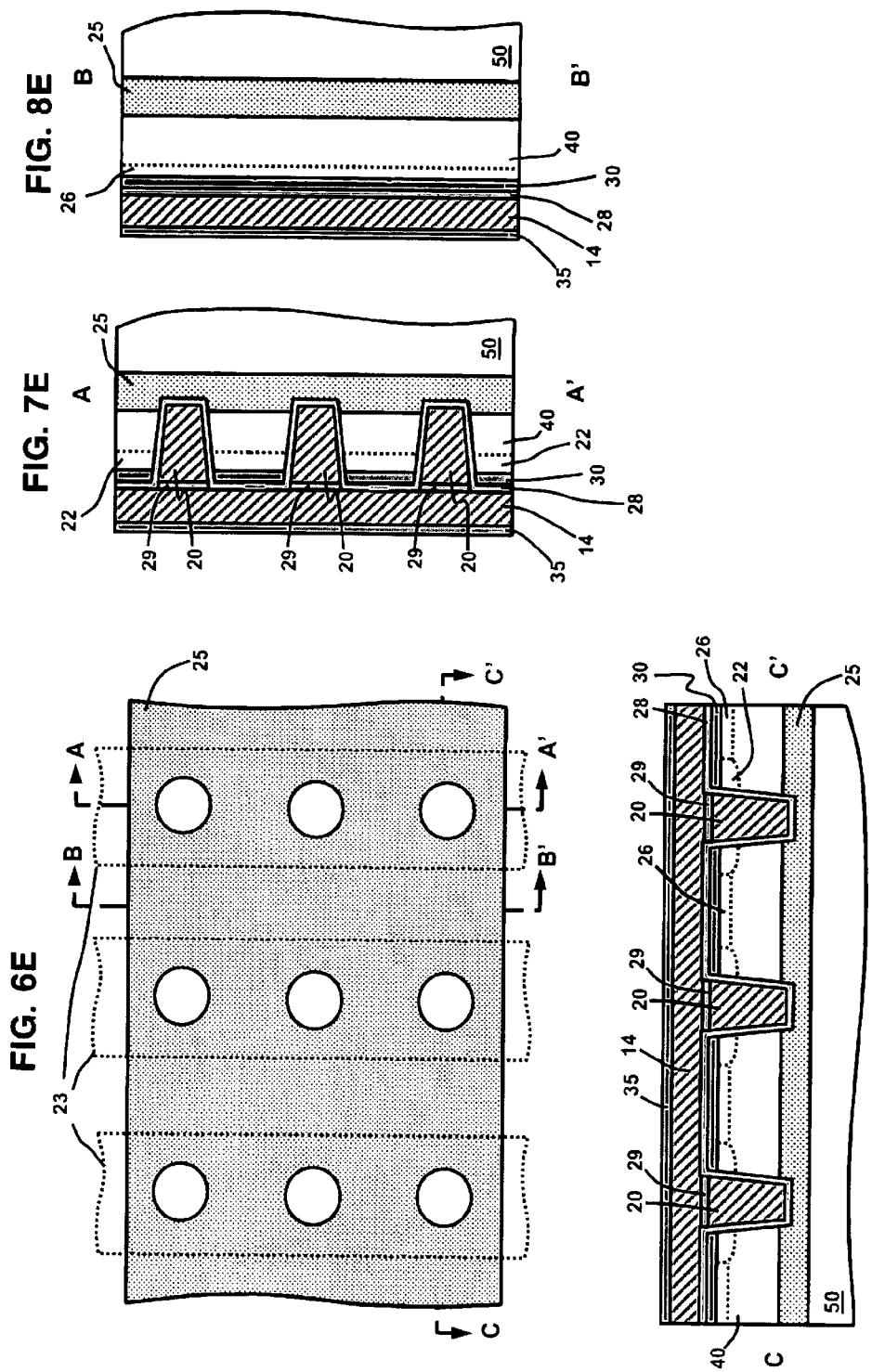

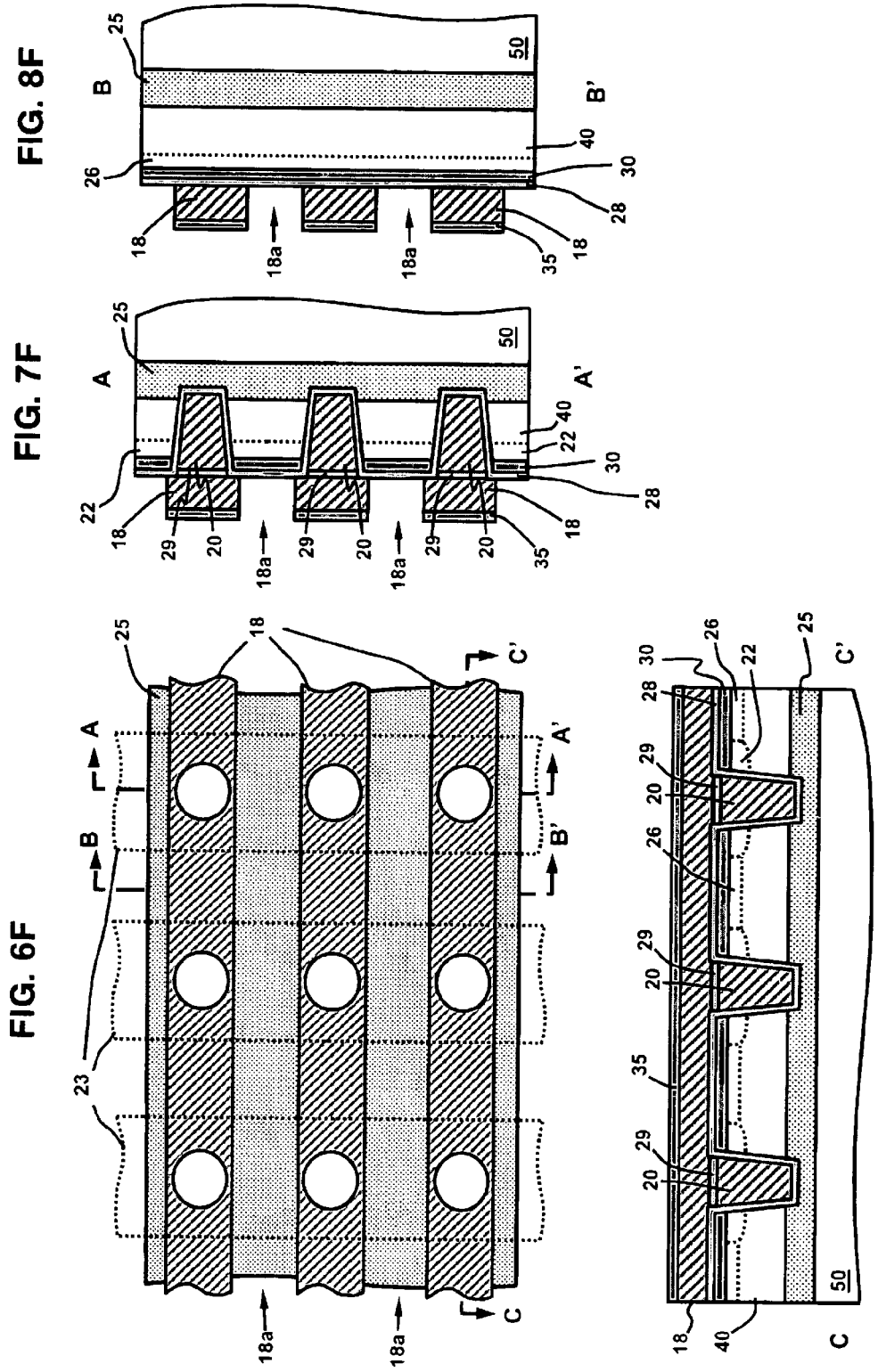

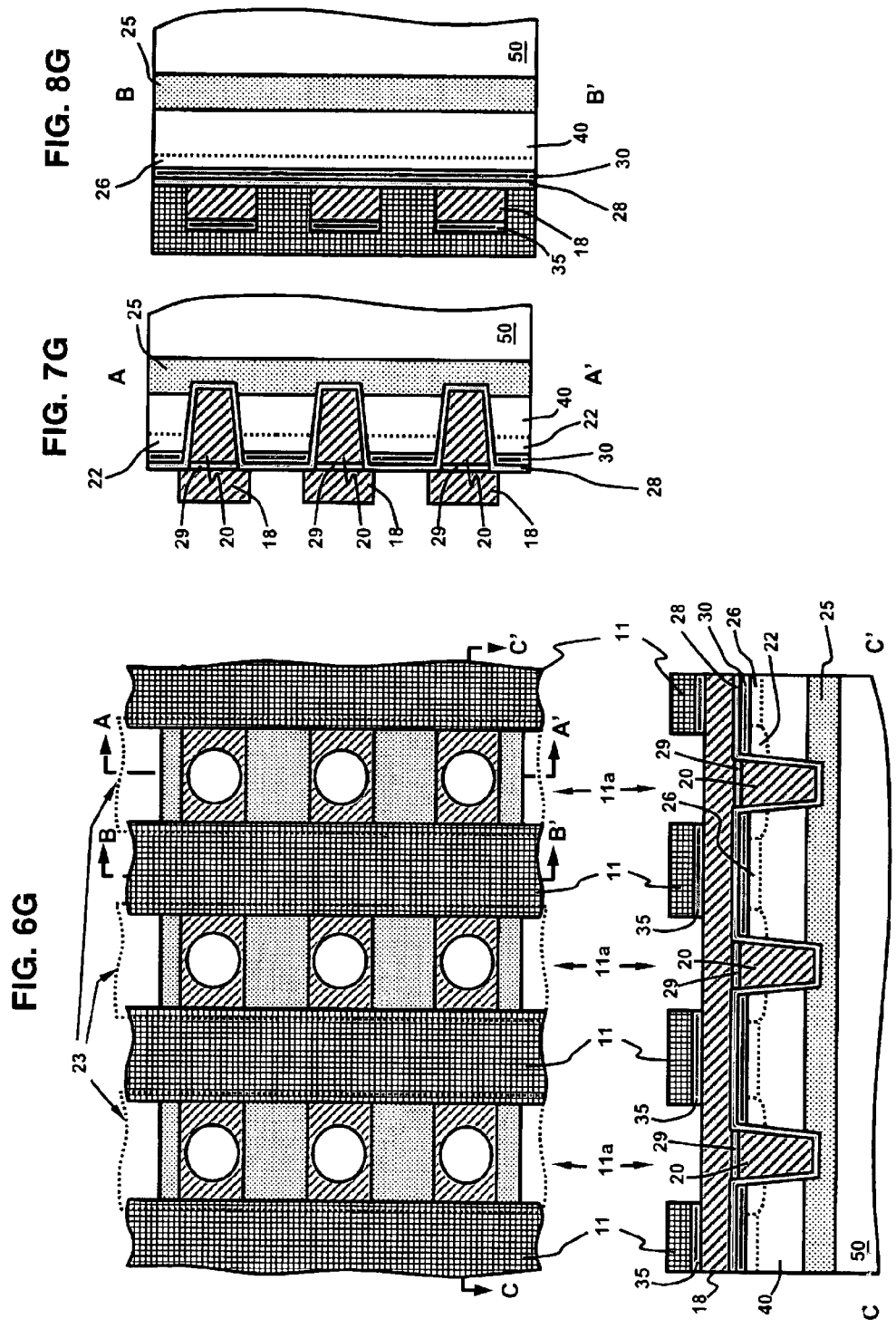

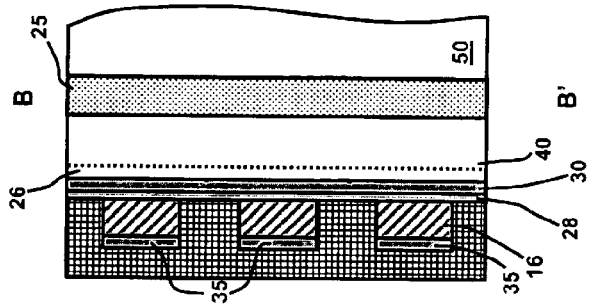
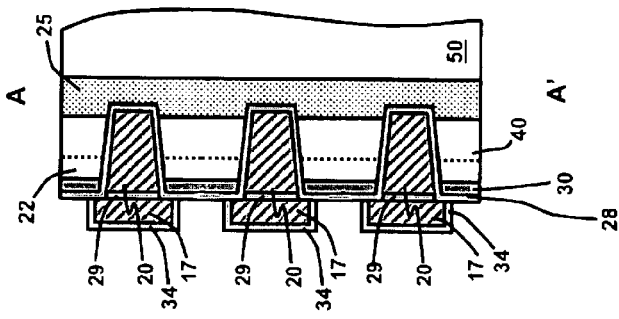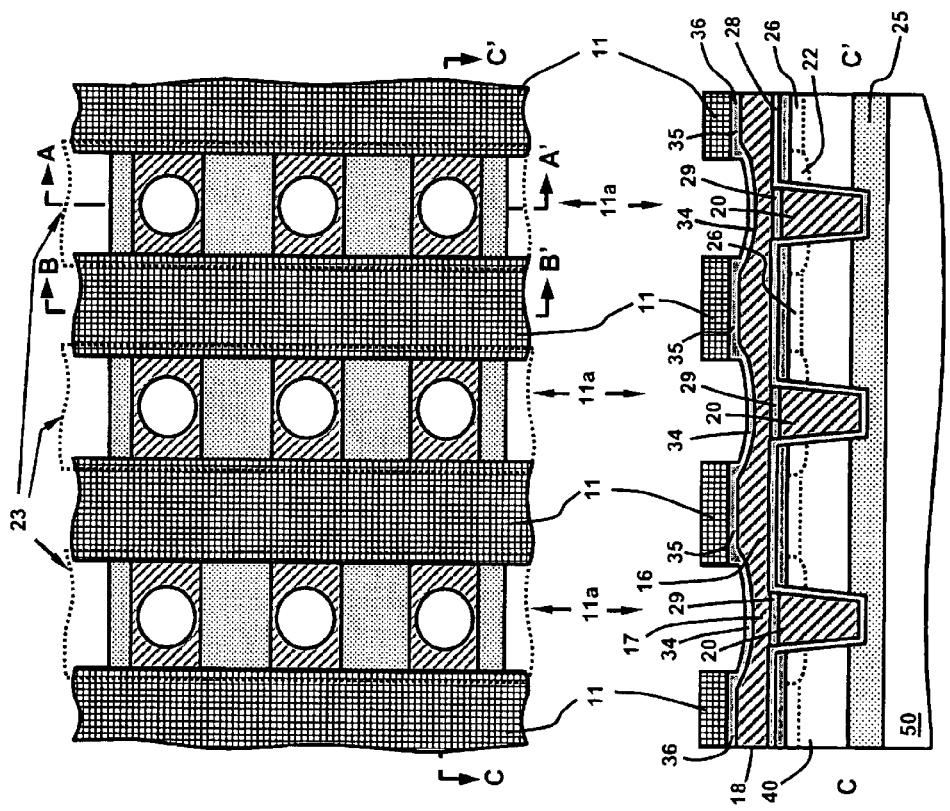

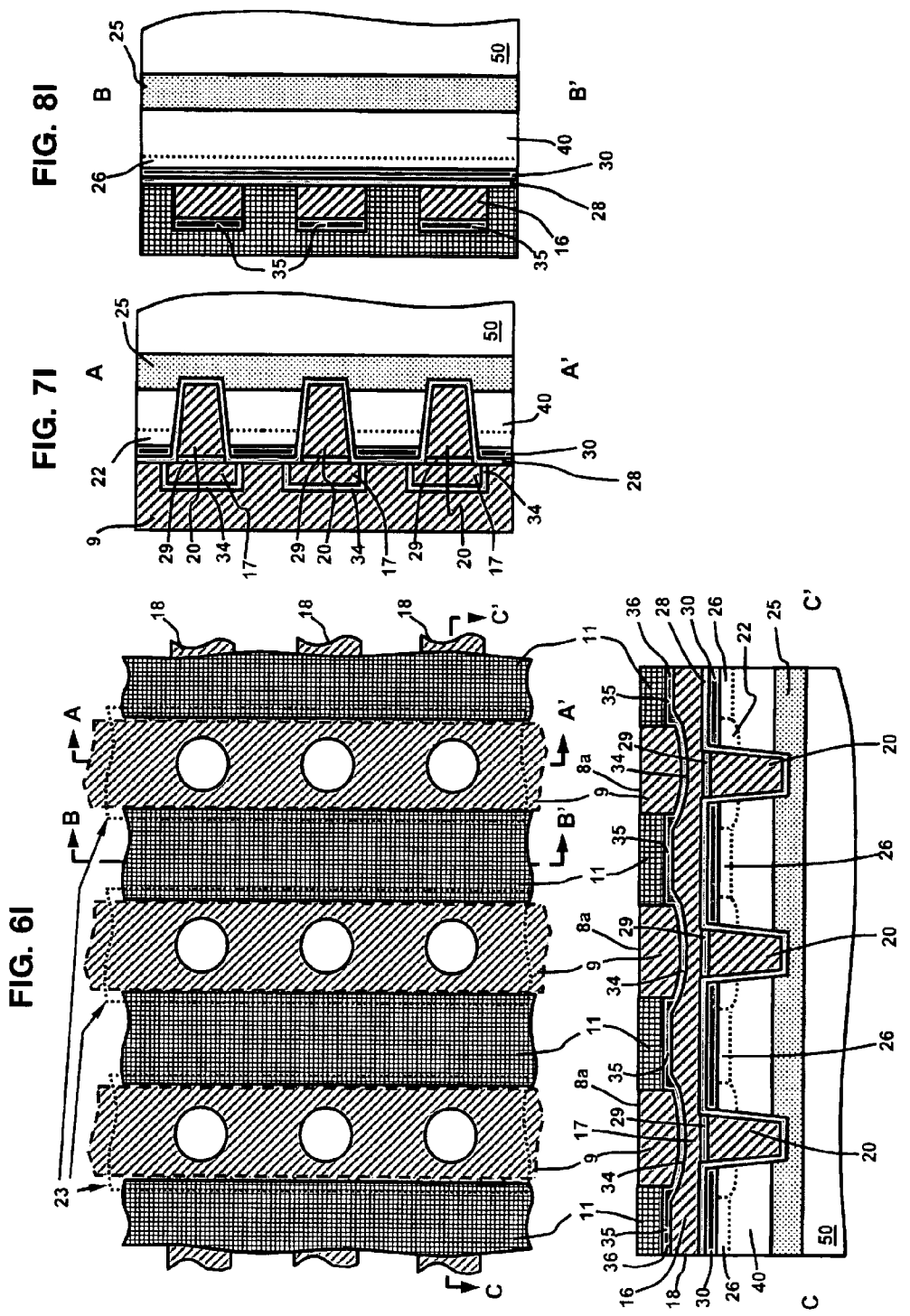

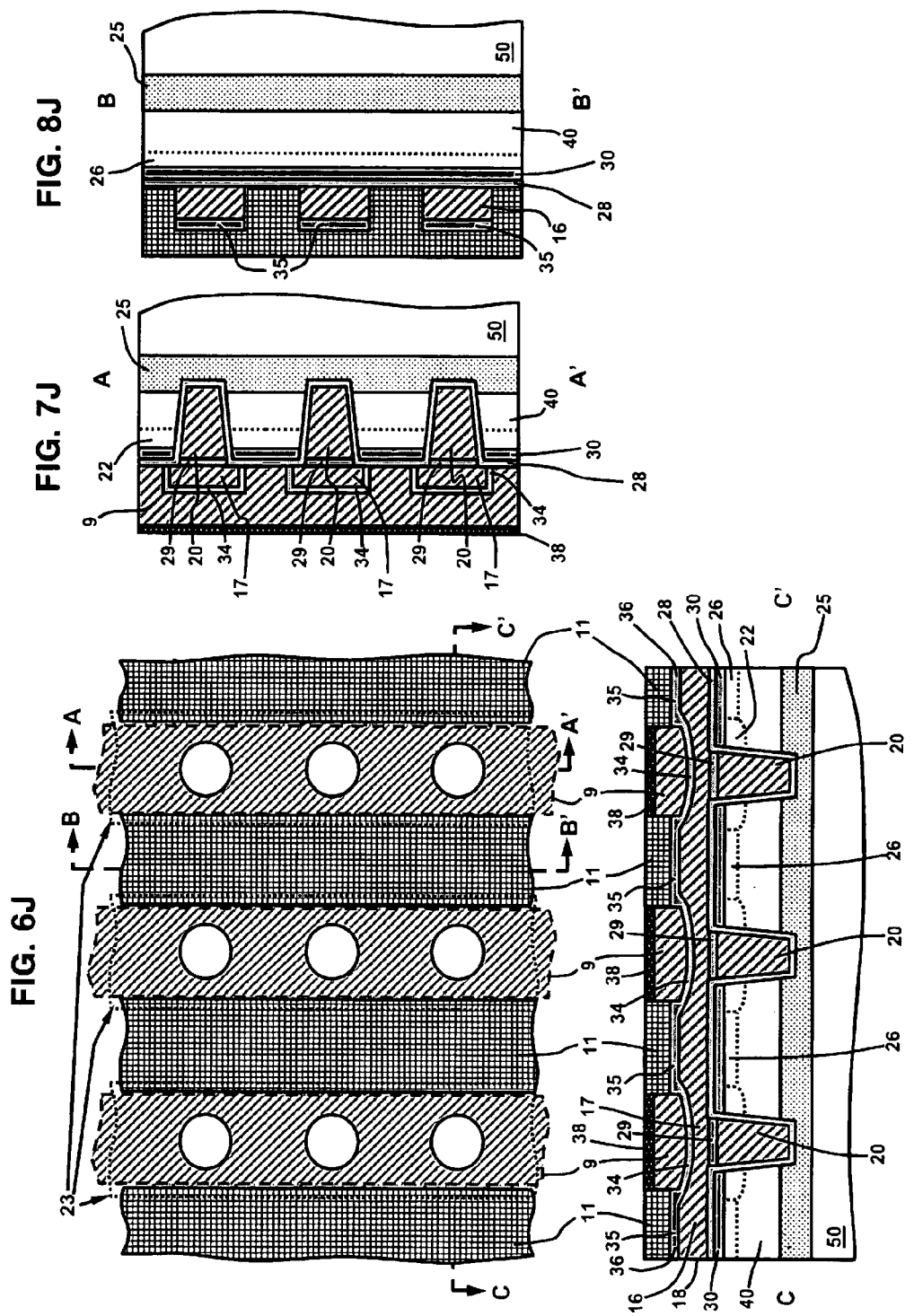

FLOATING-GATE MEMORY CELL HAVING TRENCH STRUCTURE WITH BALLISTIC-CHARGE INJECTOR, AND THE ARRAY OF MEMORY CELLS

TECHNICAL FIELD

The present invention deals with nonvolatile memory, and relates more specifically to Electrically Programmable Read Only Memories (EPROM) and Electrically Erasable and Programmable Read Only Memories (EEPROM). More particularly, the present invention relates to memory cell architecture and methods forming cells and arrays of nonvolatile memory cell with floating gate.

BACKGROUND OF THE INVENTION

Non-volatile semiconductor memory cells using a floating gate to store charges thereon and memory arrays of such non-volatile memory cells formed in a semiconductor substrate are well known in the art. Typically, the memory cell is electrically programmable and erasable by transporting charges in and out of a floating gate that is electrically insulated from but capacitively coupled to the surrounding electrodes. The amounts of charges retained in the floating gate define the states of a memory cell. Typically, the states thus defined can be either two levels or more than two levels (for multi-level states storage). The memory cell of such floating gate memory cells have been of the split gate type, or stacked gate type, or a combination thereof.

In current state-of-the-art nonvolatile memories, high voltage (typically ranging from 9 to 20V) is largely seen in cell operations (e.g. erase and program) in order to achieve desired memory states. Infrastructure for on-chip high voltage generation is thus essential to support the memory cell operations and has become an essential block in nonvolatile memories and products. The infrastructure involves separate sets of transistors used for handling high voltages and typically required adding at least 5 extra masks to a conventional CMOS technology. Therefore, it complicates process technology for nonvolatile memories.

Another issue on the high voltage infrastructure is its scalability along new generation technology. The high voltage is found un-scalable or difficult to be scaled due to the physics employed in memory cell operation. In a clear contrast, the operating voltage for logic circuits has been continuously scaled down in the past decades along with the scaling on minimum geometry of CMOS technology. An increasingly larger gap between voltages operating the logic circuits and the memory cells is seen. The issue is more pronounced and aggravated as CMOS technology scaled beyond 0.25 um generation. As a result, a larger overhead, in terms of the area occupied by high voltage circuitry, is often seen in newer generation memory products (in both stand-alone and embedded nonvolatile memory products). The scaling limit on high voltage further imposes constraints on the scaling of the minimum feature size for high-voltage transistors. Often, same sets of design rule for high-voltage transistors are used from one generation products to the next. Furthermore the high voltage operation introduces more issues in product functionality and reliability area.

U.S. Pat. No. 5,780,341 seek to overcome the problems by introducing a step channel/drain architecture into split gate type or stacked gate type cells, where electron charges are transported into floating gate through channel hot electron (CHE) or through source-side injection (SSI) mechanisms. The charges are transported out of floating gate through Fowler-Nordheim tunneling mechanism. However, the mechanisms thus involved require high voltages to support the operation. It was shown the step channel/drain cell structure can help achieving higher efficiency for charge injection. Given the efforts thus devoted, nevertheless, it was shown the voltage as high as 10V still be essential for cell operations. It is believed that the high voltage demands stringent control on the quality of the insulator surrounding the floating gate. The structures thus are vulnerable to manufacturing and reliability issues.

U.S. Pat. No. 6,372,617 seeks to minimize the high voltage by forming floating gate in concave shape through forming polycrystalline silicon spacers atop of floating gate edges. The floating gate architecture thus formed can maximize the capacitive coupling between control gate and floating gate electrodes. Similar effort has also been devoted on the same subject by maximizing floating gate area through forming hemispherical grained polycrystalline silicon on floating gate of concave shape, where high voltage in cell operation is shown reducible to around 16V. Kitamura T. et al., "A Low Voltage Operating Flash Cell with High Coupling Ratio Using Horned Floating Gate with HSG", Symposium on VSLI Technology Dig. Technical Papers, pp. 104–105 (1998). However, the polycrystalline silicon spacer formation for concave floating gate adds complexity to the process. In addition, the large topography of the concave floating gate adds difficulty on subsequent process steps (e.g. word-line formation). Both make manufacturing be difficult. Furthermore, the concave floating gate architecture introduces larger step height around floating gate edge, which increase floating gate-to-floating gate interference and is in general against cell-to-cell spacing scaling.

Cell requirement on high voltage further impose constraints on its size scaling. For example, the high voltage handling capability of memory cells requires gate-length of a memory cell be long enough to avoid drain-to-source punch-through. As a result, it imposes scaling barriers on new generation technology, in terms of the minimum feature size on transistor length of a memory cell. Similar to the issues encountered in high voltage transistors, the issue in cell scaling is more pronounced and aggravated as technology scaled beyond 0.25 um generation. In terms of the cell physical size, the issue imposes a scaling constraint on the overall cell height (i.e. cell dimension defined in the direction of bit-line).

Another main issue on the memories scaling is the minimum thickness of the oxide encapsulating the floating gate. A theoretical value of 5–6 nm has been reported as the limit for an intrinsic oxide layer, in order to avoid charge leakage due to the Fowler-Nordheim tunneling. K. Naruke et al, "Stress Induced Leakage Current Limiting to Scale Down EEPROM Tunnel Oxide Thickness", IEDM Technical Digest, pp. 424–427, 1988. However, extra leakage current often is induced after oxide dielectrics undergo a high voltage stress. As a result of this, to maintain the same level of low leakage and hence to retain stored charges within the floating gate per typical product specifications, it has been consistently reported that a minimum thickness of about 8–9 nm be used in production over several technology generations. S. Lai, "Flash Memories: Where We Were and Where We Are Going", IEDM Technical Digest, pp. 971–973, 1998. This requirement on minimum oxide thickness limits the scalability of the cell channel width, when a minimum read current need be supplied from cells with a limited minimum gate-length. In terms of the cell physical size, the issue imposes a scaling constraint on the overall cell width (i.e. cell dimension defined in the direction of word-line).

The issues outlined above on cell size scaling are commonly seen in nonvolatile memory cells employing stacked gate EEPROM architecture, such as U.S. Pat. No. 4,957,877. Several proposals have been disclosed to overcome the obstacles for achieving a more compact cell size. U.S. Pat. No. 5,146,426 disclosed floating-gate and control-gate of memory cell formed in a "contact hole"-like trench, whereas, U.S. Pat. Nos. 5,432,739 and 5,563,083 disclosed floating-gate and the control-gate of memory cell formed along sidewall of a pillar-like silicon region. These types of cells can achieve significantly smaller cell size than those in stacked gate EEPROM of an equivalent generation technology. D. Kuo et al., "TEFET—A High Density, Low Erase Voltage, Trench Flash EEPROM", Symposium on VSLI Technology Dig. Technical Papers, pp. 51–52 (1994); H. Pein et al, "Performance of the 3-D Sidewall Flash EPROM Cell", IEDM Technical Digest, pp. 11–14 (1993). These cells however, require voltage higher than 12V for cell erase operation, and there are draw back yet to be overcome. For example, U.S. Pat. No. 5,146,426 use cells with buried source biased at high voltage for erase operation. A thinning on gate dielectric around the trench corner is proposed to form a localized high field enhancing charge transport therein during an erase operation. Given the efforts, the operating voltage is still quite high and a stringent control on the oxide integrity is deemed essential. In addition, a graded source junction is essential for this type of cell in order to sustain the high voltage. The high voltage in together with its operation through a buried source substantially adds limitations on achievable minimum spacing between the buried source regions and, therefore, restraints its future scaling. The constraints further complicate the memory array segmentation and block integration, which adversely enlarge the overall area of memory array, and therefore counteract its advantage on a smaller cell size. Furthermore, in U.S. Pat. No. 5,146,426, the trench bottom of each of the cells must be formed in the buried source within a tightly controlled depth in order for all the cells successfully operated during an erase operation. This stringent requirement is believed introducing significant manufacturing difficulties. U.S. Pat. Nos. 5,432,739 and 5,563,083 use pillar-like cell for compact cell size. This type of cell relies on large topography for floating gate and control gate formation, where polycrystalline silicon spacers are largely employed. Other than the draw back on needs for high voltage, it is generally believed that large topography and stringent condition for forming polycrystalline silicon spacers add process complexity, and hence make manufacturing difficult.

SUMMARY OF THE INVENTION

The present invention solves the aforementioned problems by providing improvements on EPROM and EEPROM memory cell. Specifically on cell architecture and fabrication method for compact cell size, as well as on cell operation method enabling memory cells for extended applications without needs on high voltage. Additionally, the present invention does not require stringent control on trench depth as observed in U.S. Pat. No. 5,146,426 nor involve a large topography in cell structure as observed in U.S. Pat. Nos. 5,432,739 and 5,563,083. The present invention therefore further provides advantages on better manufacturability over prior inventions.

In one aspect of the present invention, an electrical erasable and programmable read only memory device includes: a first layer of semiconductor material over a bulk material and having a first conductivity type; a first region formed in between the bulk material and the first layer, and having a second conductivity type; a trench formed into a surface of the first layer and having a sidewall and a bottom; a second region formed in the first layer, laterally adjacent to an upper portion of the trench, and having the second conductivity type; a channel region in the first layer between the first region and the second region, and extending generally along the sidewall of the trench; an electrically conductive floating gate disposed adjacent to and insulated from the channel region; an electrically conductive control gate having at least a portion thereof disposed over and insulated from the floating gate; and an electrically conductive tunneling gate disposed over and insulated from at least a portion of the control gate.

In another aspect of the present invention, an array of electrically programmable and erasable memory devices includes: a first layer of semiconductor material over a bulk material and having a first conductivity type; spaced apart isolation regions formed in the first layer which are generally parallel to one another and extend in a first direction with an active region between each pair of adjacent isolation regions; and spaced apart drain-lines extend in the first direction with each of the drain-line formed in at least a portion of the active region and next to the surface of the first layer. Each of the active regions includes a plurality of memory cells and each of the memory cells includes: a first region formed in between the bulk material and the first layer, and having a second conductivity type; a trench formed into a surface of the first layer and having a sidewall and a bottom; a second region formed in the first layer, laterally adjacent to an upper portion of the trench, and having the second conductivity type; a channel region in the first layer between the first region and the second region, and extending generally along the sidewall of the trench; an electrically conductive floating gate disposed adjacent to and insulated from the channel region; an electrically conductive control gate having at least a portion thereof disposed over and insulated from the floating gate; and an electrically conductive tunneling gate disposed over and insulated from at least a portion of the control gate.

In yet another aspect of the present invention, a method of forming an electrically erasable and programmable read only memory cell includes the steps of forming a first layer of semiconductor material over a bulk material and having a first conductivity type, forming a first region in between the bulk material and the first layer, and having a second conductivity type, forming a trench into a surface of the first layer and having a sidewall and a bottom, forming a second region in the first layer, laterally adjacent to an upper portion of the trench, and having the second conductivity type, forming a channel region in the first layer between the first region and the second region, and extending generally along the sidewall of the trench, forming an electrically conductive floating gate disposed adjacent to and insulated from the channel region, forming an electrically conductive control gate having at least a portion thereof disposed over and insulated from the floating gate, and forming an electrically conductive tunneling gate disposed over and insulated from at least a portion of the control gate.

In still another aspect of the present invention, a method forming an array of electrically programmable and erasable memory devices comprising the steps of forming spaced apart isolation regions in a first layer of semiconductor material, which is over a bulk material and having a first conductivity type, wherein the isolation regions are generally parallel to one another and extend in a first direction with an active region between each pair of adjacent isolation regions, forming spaced apart drain-lines extending in the first direction with each of the drain-lines formed in at least a portion of one of the active regions and next to a surface of the first layer, forming a plurality of trenches into the surface of the first layer and arranged in an array of columns extending in the first direction and rows in a second direction generally perpendicular to the first direction, wherein each of the trenches has a sidewall and a bottom, forming a plurality of first regions each in between the bulk material and the first layer, and having a second conductivity type, forming a plurality of second regions each laterally adjacent to an upper portion of one of the trenches, and having the second conductivity type, forming a plurality of channel regions in the first layer each extending between one of the first regions and one of the second regions, and extending generally along the sidewall of one of the trenches, forming a plurality of electrically conductive floating gates each disposed adjacent to and insulated from one of the channel regions, forming a plurality of electrically conductive control gates each having at least a portion thereof disposed over and insulated from one of the floating gates, and forming a plurality of electrically conductive tunneling gates each disposed over and insulated from at least a portion of one of the control gates.

Another aspect of the present invention is a method of operating an electrically programmable and erasable memory device having an electrical conductive floating gate formed in a trench in a semiconductor substrate, an electrical conductive control gate having a portion disposed over and insulated from the floating gate, an electrical conductive tunneling gate disposed over and insulated from the control gate by an insulating layer to form a multi-layer structure permitting both electron and hole charges tunneling through the insulating layer at a generally similar rate, and spaced apart source and drain regions formed with the source region disposed adjacent to and insulated from a lower portion of the floating gate and with the drain region disposed adjacent to and insulated from an upper portion of the floating gate with a channel region formed therebetween and along a sidewall of the trench. The method comprising the steps of placing a positive voltage on the drain region to capacitively couple a positive voltage onto the floating gate; and placing a voltage on the tunneling gate that is sufficiently negative relative to a voltage of the control gate to emanate electrons from the tunneling gate and to emanate holes from the control gate to permit electrons and holes tunneling through the insulating layer at a generally similar rate and in opposite directions with electrons having sufficient energy to transport through the control gate, and onto the floating gate via ballistic carrier transport mechanism.

In one last aspect of the present invention is a method of operating an electrically programmable and erasable memory device having at least two states, and includes an electrical conductive floating gate formed in a semiconductor substrate, an electrical conductive control gate having a portion disposed over and insulated from the floating gate, and an electrical conductive tunneling gate disposed over and insulated from the control gate by an insulating layer to form a multi-layers structure permitting both electron and hole charges tunneling through the insulating layer at a generally similar rate, wherein a spaced apart source and drain regions are formed adjacent to and insulated from the floating gate with a channel region defined therebetween and insulated from the floating gate. The method comprises the step of establishing each of the states of the memory cell by emanating electrons from the tunneling gate and emanating holes from the control gate to permit electrons and holes transporting through the insulating layer at an generally similar rate and in opposite directions with electrons having sufficient energy to transport through the control gate and onto the floating gate via ballistic carrier transport mechanism, and establishing each of the states of the memory cell by emanating holes from the tunneling gate and emanating electrons from the control gate to permit electrons and holes transporting through the insulating layer at an generally similar rate and in opposite directions with holes having sufficient energy to transport through the control gate and onto the floating gate via ballistic carrier transport mechanism.

Other objects and features of the present invention will become apparent by a review of the description, specification, claims and appended figures.

BRIEF DESCRIPTION OF THE DRAWINGS

FIGS. 1A-1, 1A-2, 1A-3 are enlarge partial cross sections of alternate configurations on control gate in accordance with the present invention.

FIG. 3 is the barrier height for holes and for electrons at both valence and conduction energy bands and their variation with fractional oxide in a dielectric in accordance with the present invention.

FIGS. 6A–6J are top views of the structures showing in sequence the next step(s) in the formation of a non-volatile memory array of floating memory cells of the present invention.

FIGS. 7A–7J are cross sectional views taken along the line A-A' in FIGS. 6A–6J illustrating in sequence the steps in processing of the structure shown in FIG. 1A to form the non-volatile memory cell array of the present invention.

FIGS. 8A–8J are cross sectional views taken along the line B-B' in FIGS. 6A–6J illustrating in sequence the steps in processing of the structure shown in FIG. 1A to form the non-volatile memory cell array of the present invention.

FIGS. 9A–9J are cross sectional views taken along the line C-C' in FIGS. 6A–6J illustrating in sequence the steps in processing of the structure shown in FIG. 1A to form the non-volatile memory cell array of the present invention

DETAILED DESCRIPTION OF THE PREFERRED EMBODIMENTS

Memory Cell

Figure 1A:
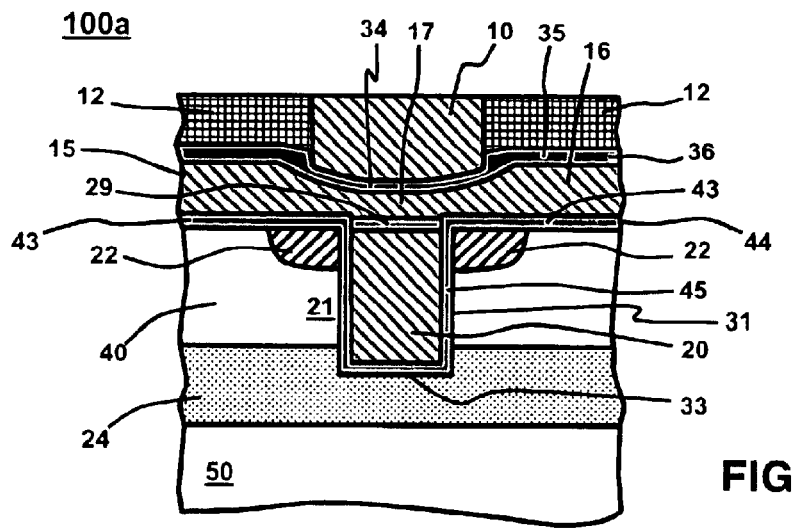
FIG. 1A is a cross sectional view of a non-volatile electrically alterable memory cell in accordance with the first embodiment of the present invention, wherein the floating gate is substantially in a rectangular shape.
Figures 1, 1A:
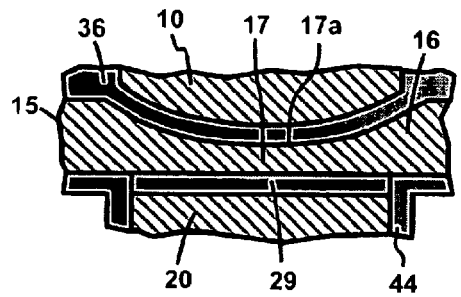
Figures 1, 1A, 2:
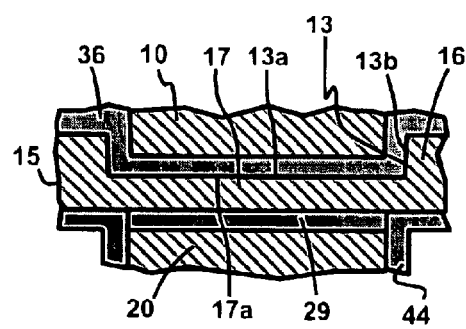

Referring to FIGS. 1A through 1D, there are shown cross sectional view of a single transistor non-volatile memory cell in accordance with the first embodiment of this invention. Memory cell 100a in FIG. 1A comprises a bulk material 50, which can be either a semiconductor material, such as silicon, or an insulator, such as silicon oxide, silicon sulfide or other dielectrics well-known in the art. For the preferred embodiment, the bulk material 50 can be silicon of a first conductivity type (p-type hereinafter) with a lower doping level in the range between about 1E15 atom/cm$^{-3}$ to about 5E17 atom/cm$^{-3}$. On the bulk material 50 is a first semiconductor layer 40 of the first conductivity type with a higher doping level than the bulk material 50 and is in the range between about 5E15 atom/cm$^{-3}$ to about 5E18 atom/cm$^{-3}$. The thickness of the first layer 40 can be on the order of about 0.2 $\mu$m to about 4 $\mu$m. Both the bulk material 50 and the first semiconductor layer 40 are collectively referred to as substrate 51 for the memory cell hereinafter. A heavily-doped first region 24 of a second conductivity type (n-type hereinafter) is embedded in between the first layer 40 and the bulk material 50, and can be formed with majority portion of the region resides either in the first layer 40 or in the bulk material 50. The heavily-doped first region 24 can be with a doping level in the range of about 1E18 atom/cm$^{-3}$ to about 5E21 atom/cm$^{-3}$ and a thickness in the range of about 0.2 $\mu$m to about 2 $\mu$m. The first region 24 forms the source region of the memory cell, whereas the first layer 40 forms the memory well region, wherein individual memory cell resides. Within the memory well 40, a heavily-doped second region 22 of a second conductivity type with a doping level in the range of about 1E19 atom/cm$^{-3}$ to about 5E21 atom/cm$^{-3}$ and a thickness of about 0.05 $\mu$m to about 0.15 $\mu$m is defined in location adjacent to the surface of the memory well 40. The second region 22 thus defined forms the drain region of the memory cell. A trench hole with a trench sidewall 31 extends through both the drain region 22 as well as the memory well 40 with a trench bottom 33 preferably reside within the source region 24. The drain region 22, in together with the source region 24 defined therebetween a channel region 21 formed along the trench sidewall 31. Disposed over the memory well region 40, the drain region 22, the channel region 21, and the trench bottom region 33 is a first layer of insulating material 44, which can be made from silicon dioxide (hereinafter "oxide"), silicon nitride (hereinafter "nitride"), silicon oxynitride (hereinafter "oxynitride") or materials with high dielectric constant (such as aluminum oxide, hafnium oxide, zirconium oxide etc). The first insulation layer 44 has a first portion 43 disposed over the memory well 40 and the drain 22, and a second portion 45 disposed adjacent to the trench sidewall 31 and over the trench bottom 33. The first portion 43 of the first insulation layer 44 can be with thickness on the order of 80 to 2000 angstrom. The second portion 45 of the first insulation layer 44 can be with thickness on the order of 50 to 500 angstrom. A floating gate 20 is provided within a trench hole and is insulated from the regions of drain 22, memory well 40, and source 24 through the first insulating layer 44. The floating gate can be with a width on the order of about 0.03 $\mu$m to about 0.8 $\mu$m and with a thickness on the order of about 0.2 $\mu$m to about 4 $\mu$m and is generally in a rectangular shape. Disposed over the floating gate 20 is a second layer 29 of insulating material, on the order of 50 to 400 angstrom of thickness. The second layer 29 can be made from oxide, nitride, oxynitride, aluminum oxide, hafnium oxide, zirconium oxide or a combination of these materials, such as oxide/nitride/oxide composite film. Disposed over the first insulating layer 44 and the second insulating layer 29 is a control gate 15, which can be a heavily doped polycrystalline silicon (hereinafter "polysilicon"), low resistivity interconnect material such as silicide, or a refractory metal. In a preferred embodiment, the control gate 15 comprises two portions: A first portion 16 is with a thickness on the order of 400 to 4000 angstrom and is substantially disposed over the first portion 43 of the first insulating layer 44; a second portion 17 is with a thickness on the order of 50 to 1000 angstrom and is substantially disposed over the second insulating layer 29. Other alternate configurations on the control gate 15 will be described in a greater detail hereinafter. A third insulating material 36 has a first portion 35 disposed over the first portion 16 of the control gate 15, and a second portion 34 disposed over the second portion 17 of the control gate 15. The first portion 35 of the third insulating material 36 can be oxide, nitride, oxynitride, aluminum oxide, hafnium oxide, zirconium oxide or a combination of these materials, and is on the order of 100 to 1000 angstrom in thickness. The second portion 34 of the third insulating material 36 can be oxide, nitride, oxynitride, materials with high dielectric constant (such as such as aluminum oxide, hafnium oxide, zirconium oxide etc.) or a combination of these materials, and is on the order of 30 to 200 angstrom in thickness. Atop of the second portion 34 of the third insulating material 36 is a tunneling gate 10, which can be a heavily doped polycrystalline silicon (hereinafter "polysilicon"), low resistivity interconnect material such as silicide, or a refractory metal, with a thickness on the order of 1000 to 4000 angstrom. Disposed over the first portion 35 of the third insulating material 36 is a fourth insulating material 12, which can be made from oxide, nitride, or oxynitride, and is with a thickness on the order of 500 to 10000 angstrom.

FIGS. 1A-1, 1A-2, 1A-3 show enlarged view illustrating partial cross sections of three alternate configurations on control gate 15. In the embodiments shown in FIGS. 1A-1 and 1A-2, the object is to form a second portion 17 of the control gate 15 with a reduced thickness than the first portion 16 to enhance ballistic carriers transporting therethrough during a program or an erase operation of the cells in accordance with the present invention. In the embodiment shown in FIG. 1A-1, the reduced thickness is achieved by providing the second portion 17 with a recessed surface 17a inward toward the control gate 15, wherein the recessed surface 17a is substantially a concave contour. In the embodiment shown in FIG. 1A-2, the reduced thickness on the second portion 17 is achieved by providing the recessed surface 17a of the second portion 17 in line with the bottom surface 13a of a semi-recessed trench 13 formed within the control gate 15, wherein the trench sidewall 13b is substantially perpendicular to the substrate surface. The degree of thinning on the second portion 17 can be determined based on the type of materials used for the control gate 15 and based on the desired optimum performance of the cell operation, and is in general range from about 10% to about 90% of the thickness of the first portion 16. Finally, there is shown the embodiment with a simpler configuration on control gate 15 in FIG. 1A-3. The structure comprises control gate 15 configured with the second portion 17 being substantially identical, in thickness, to the first portion 16. The main advantage of this embodiment is on the simpler process for forming the control gate 15 during cell manufacturing.

Figures 1, 1A, 2, 3:
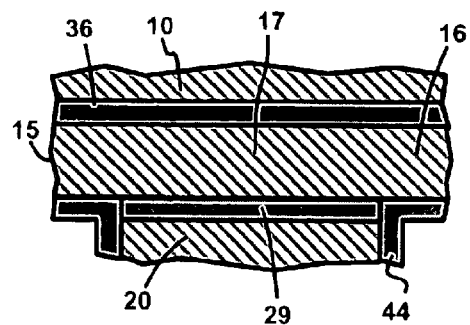
Figure 1B:
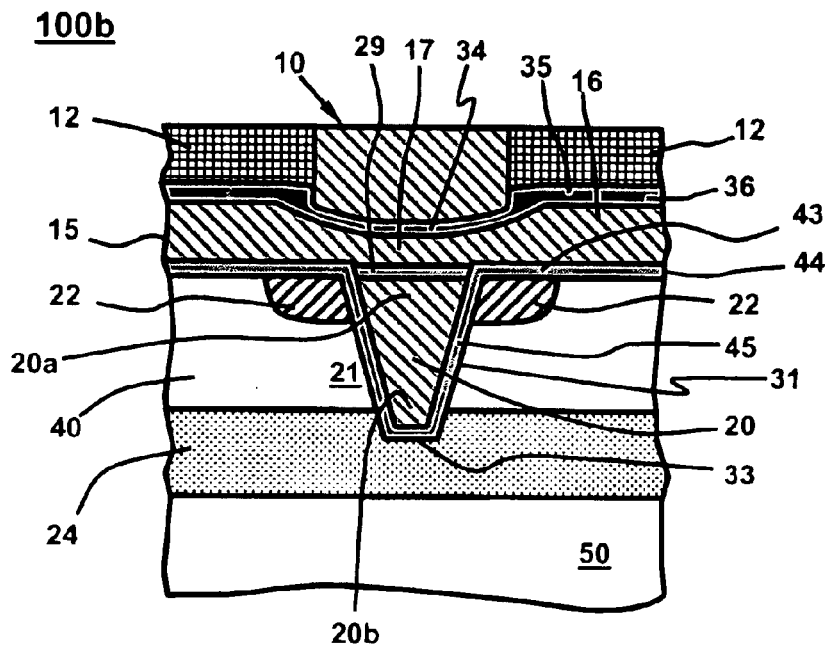
FIG. 1B is a cross sectional view of a non-volatile electrically alterable memory cell in accordance with the first embodiment of the present invention, wherein the floating gate is substantially in a "V" shape.

Memory cell 100b shown in FIG. 1B comprises similar provisions as defined in the memory cell 100a in FIG. 1A except with a major difference on the floating gate region 20. The memory cell 100a define floating gate 20 substantially in a rectangular shape, whereas memory cell 100b define floating gate 20 substantially in a "V" shape or a truncated "V" shape. The "V"-shape floating gate comprises two portions: A top portion 20a can be with a width on the order of about 0.2 $\mu$m to about 2 $\mu$m; a bottom portion 20b can be with a width on the order of about few or tens angstroms to about 0.1 $\mu$m. The provision of a "V" shape floating gate 20 results in minimum coupling capacitance between floating gate 20 and source region 24, and hence has the advantage of enhancing capacitive coupling from control gate 15 to floating gate 20.

Figure 1C:
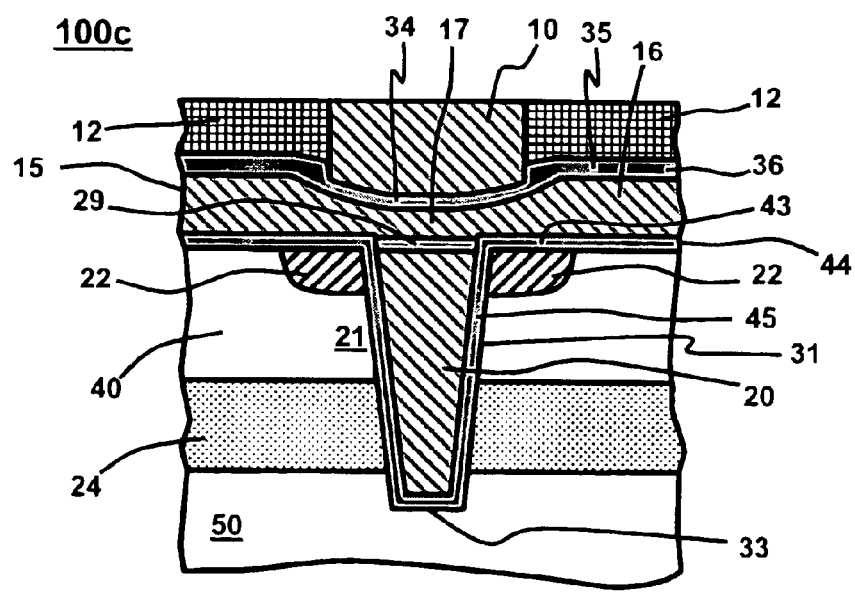
FIG. 1C is a cross sectional view of a non-volatile electrically alterable memory cell in accordance with the first embodiment of the present invention, wherein the floating gate trench extending through the source region into the substrate.

Memory cell 100c shown in FIG. 1C comprises similar provisions as defined in the memory cell 100a and 100b in FIGS. 1A and 1B, respectively, except with a major difference on the floating gate region 20. The memory cell 100b and 100a define the floating gate 20 with the trench bottom 33 reside within the source region 24, whereas memory cell 100c define floating gate 20 extending through the source region 24 with the trench bottom 33 reside within the bulk material region 50. This feature provides one of the advantages in the present invention over the prior arts as outlined earlier.

Figure 1D:
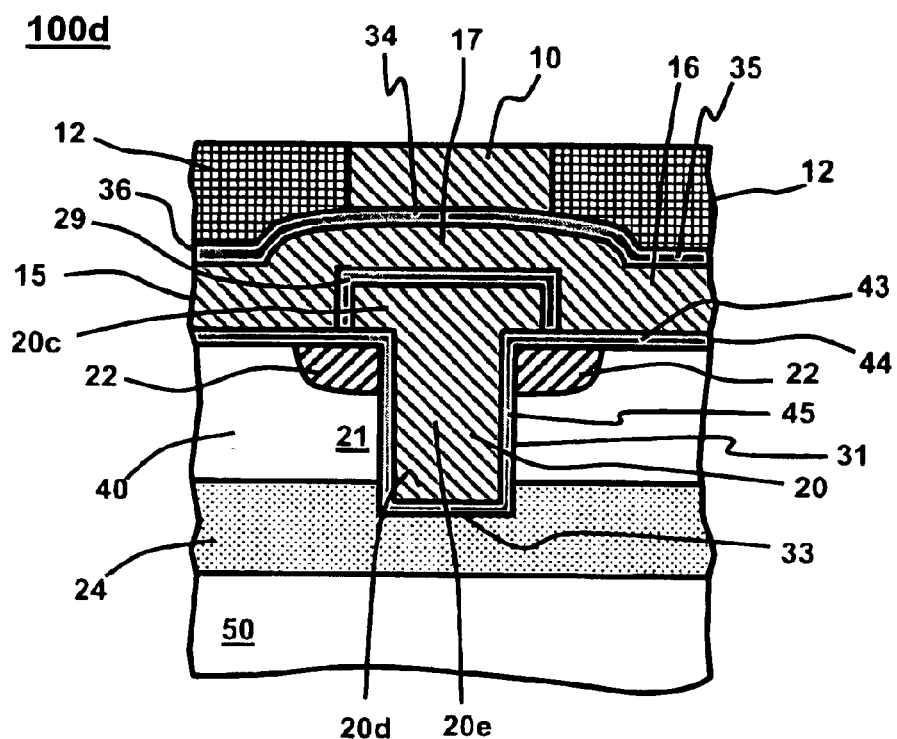
FIG. 1D is a cross sectional view of a non-volatile electrically alterable memory cell in accordance with the first embodiment of the present invention, wherein the floating gate is substantially in a "T" shape.

Memory cell 100d shown in FIG. 1D comprises similar provisions as defined in the memory cell 100a in FIG. 1A except with a major difference on the floating gate region 20. The memory cell 100a define floating gate 20 substantially in a rectangular shape with the floating gate top surface be substantially co-planar with the substrate surface, whereas memory cell 100d define floating gate 20 substantially in a "T" shape with an upper portion of the floating gate 20 be disposed over and insulated from a portion of the substrate surface. The protruding portion 20c results in the floating gate top surface substantially higher than the substrate surface. The "T"-shape floating gate comprises generally three portions: the protruding portion 20c can be with a width on the order of about 0.15 to about 2 $\mu$m; the middle portion 20e adjacent to the trench sidewall 31 can be with a width on the order of about 0.1 to about 1.5 $\mu$m, and the bottom portion 20d can be with a width on the order of about 0.05 to about 1.5 $\mu$m. The provision of a "T"-shape floating gate 20 has the advantage of a stronger capacitive coupling between the control gate 15 and the floating gate 20. Furthermore, the topography of the second portion 17 of control gate 15 has a convex shaped structure over the protruding portion 20c of the floating gate 20. A thinner thickness for the second portion 17 of the control gate 15 can be naturally achieved in manufacturing process and thus can be formed in a self-aligned manner to the floating gate region 20 thereunder. The thinner thickness for the second portion 17 has the advantage on cell operation using ballistic carriers transport.

Figure 1E:
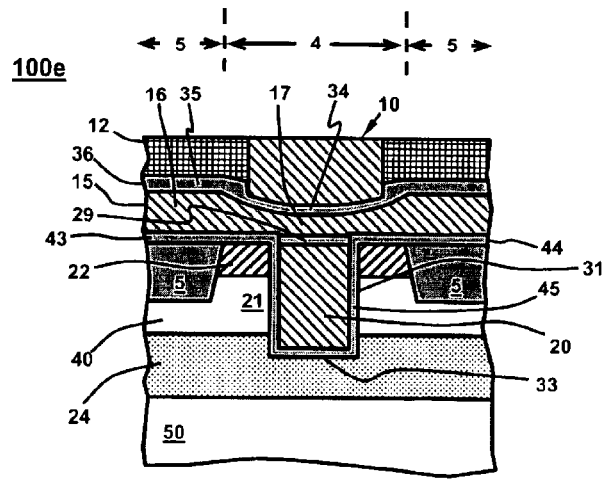
FIG. 1E is a cross sectional view of a non-volatile electrically alterable memory cell in accordance with the second embodiment of the present invention.
Figure 1F:
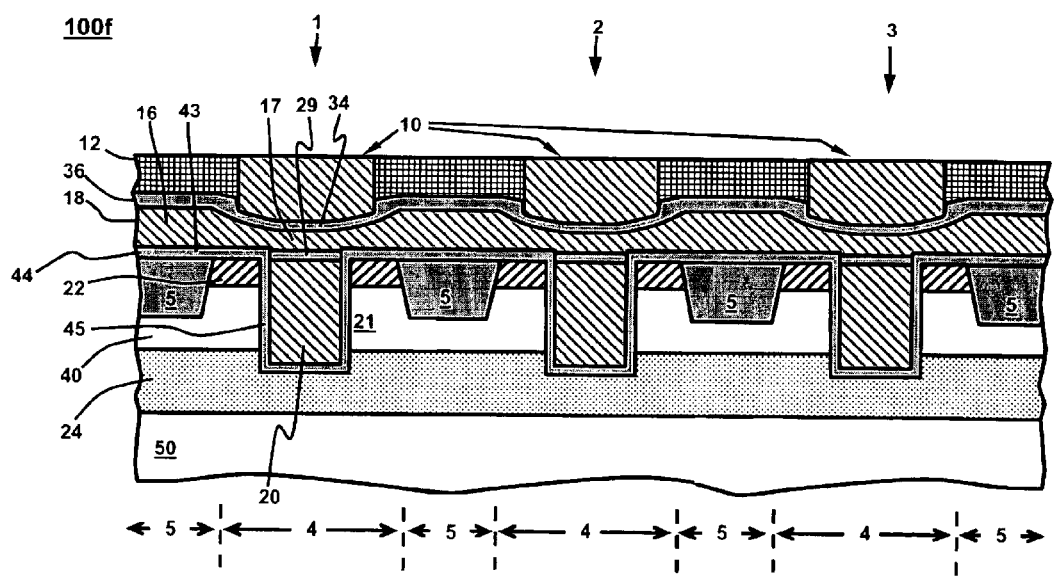
FIG. 1F is a cross sectional view of a segment of a non-volatile electrically alterable memory array in accordance with the second embodiment of the present invention.

FIG. 1E presents cross sectional view of a single transistor non-volatile memory cell 100e in accordance with a second embodiment of the present invention, wherein the memory cell 100e comprises similar provisions as defined in the memory cell 100a in FIG. 1A except with a major difference on the scheme dividing neighboring cells. The memory cell 100e define cell active region 4 through the provision of isolation regions 5 formed by well-known technique such as LOCOS process or shallow trench isolation process ("STI" hereinafter). In a preferred embodiment, the isolation region 5 is form in STI as it can be more precisely formed at smaller design rules. The STI is substantially in a rectangular shape with a thickness on the order of about 0.2 $\mu$m and a width of about 0.1 $\mu$m, and is typically made from insulator such as oxide or other dielectrics well-known in the art. The object in this embodiment is to minimize capacitive coupling between control gate 15 and memory well 40 in parasitic capacitive components contributed from the first portion 16 of the control gate 15. Minimizing the capacitive coupling of control gate 15 has the advantage on reducing capacitance seen by the control gate 15 in each memory cell and thereby reducing the access speed in a read operation of a memory cell. The scheme on cell isolation using region 5, whereby adjacent cells are divided from each other, and the effect of this scheme on minimizing capacitive loading become more appreciable with cross sectional view on structure shown in FIG. 1F, wherein there is shown a memory cell 2 such as the one shown in FIG. 1E interconnected with similar adjacent cells 1 and 3. The active regions 4, wherein memory cells reside, are interlaced with isolation regions 5 to form a segment of memory array 100f. It should be appreciated that while only a small segment of array region 100f is shown, the provisions in 100f illustrate any size of array of such regions. The control gate 15 of each cell interconnected to define a control-gate line trace 18, which is typically extended across the entire array of memory cells. For example, with an array having a plurality of interlaced columns of isolation and active regions, with a plurality of memory cells in each active region, memory cell elements such as control gates can be interconnected to continuously extend across an entire row or column of memory cells. As a result, the capacitive loading effect appear at the control-gate line 18 is a multiplication of the total number of cells on a same control-gate line to the capacitance of control gate 15 in each individual cell. Therefore, a reduction of 50% on capacitance of control gate 15 in each individual cell can be directly translated to a reduction of 50% on total capacitance of each control-gate line, thereby a 50% improvement on access speed providing other parameters and conditions in cell operation kept the same.

FIGS. 1A through 1E in general presents a provision on memory cell in accordance with the present invention, wherein the control gate overlaps with the tunneling gate at an overlapping region, and wherein at least a portion of the floating gate is disposed thereunder.

The dimensions of the cells in accordance with the present inventions are closely related to the design rules of a given generation of process technology. Therefore, the foregoing dimensions on cells and on regions defined therein are only illustrative examples. In general, however, the dimension of the memory cells must be such that charges emanating from the tunneling gate 10 are allowed to transport through the second portion of the third insulator 34 through tunneling mechanism such as direct tunneling, which typically occurs at a low voltage (e.g. 3.3V or lower), or through the Fowler-Nordheim tunneling mechanism, which occurs at a higher voltage (e.g. 7V). Furthermore, the dimensions of the second portion 17 of the control gate region 15 must be such that a large portion of charges tunneling through the insulator 34 are allowed to transport through the second portion 17 through ballistic transport mechanism and be collected by the floating gate 20 at a rate typically ranges from about 1% to tens of percent to the charges from tunneling gate 10. The specific mechanism on cell operation and the theory on transport physics will be explained in a greater detail hereinafter.

Ballistic Charges Transport Physics

The ballistic charge transport mechanism represents the physics that charge carriers moving inside a conductive material without experiencing a scattering event. The scattering usually seen in semiconductor or other type of conductors is in the form of carrier-to-carrier scattering, carrier-to-phonon scattering, and carrier-to-impurity scattering. All of these effects can results in a change on carrier momentum (and hence a change on its moving direction from its original) as well as a lost on the carrier energy. The scattering event hence disturbs the charges transport to their target. For charge carriers moving in ballistic transport, the material where charges transport through is transparent to the transporting charges, and therefore charges preserve their energy and their moving direction during their movement.

The physics on ballistic charges (electrons or holes) transporting through a conductor and insulators to make their way into the floating gate 20 will now be described in details with reference to FIGS. 2A and 2B for electron and for hole charges, respectively. In the energy band diagram shown in FIGS. 2A and 2B, a semiconductor, preferably heavily doped p-type polysilicon, is shown for both the tunneling gate electrode 52 and the ballistic transport gate region 62. More discussion on the theoretical consideration of choosing p-type over n-type polysilicon will be given in a greater detail hereinafter.

Figure 2A:
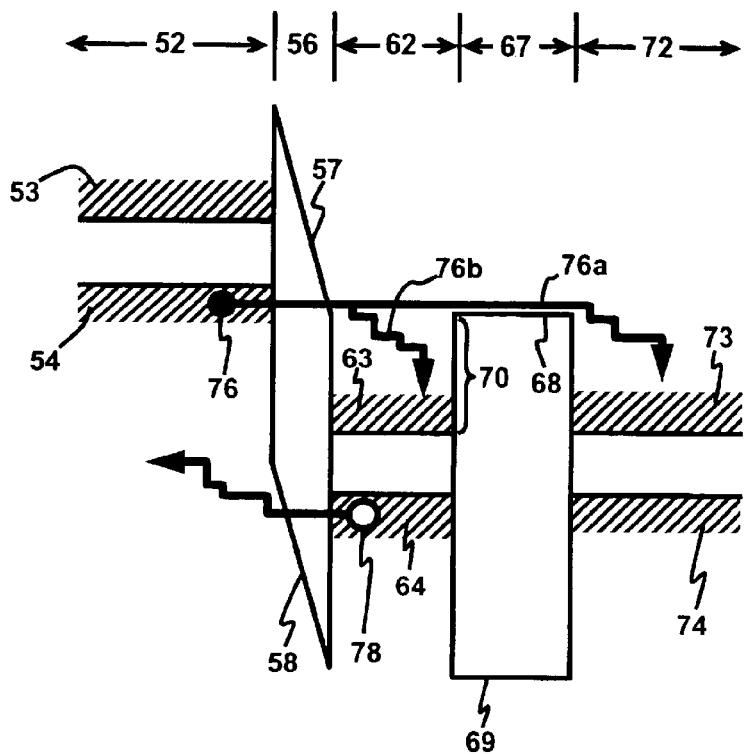
FIG. 2A is an energy band diagram for the ballistic electrons injection of the present invention.

Referring to FIG. 2A, there is shown an energy band diagram illustrating the ballistic electrons injection employed in memory cells in accordance with the present invention. In an event where ballistic electrons are injected into a floating-gate electrode region 72, the tunneling gate electrode 52 is negatively biased with respect to the ballistic-transport gate electrode 62. The valence band electrons 76, which are the electron charges in the valence band 54 of the tunneling gate electrode 52 will emanate and transport through the tunneling insulator 56 through a quantum mechanical tunneling mechanism (either Fowler-Nordheim or direct tunneling mechanisms). A portion of the electrons 76, grouped as the scattered electrons 76b, experience scattering events during their transport across the ballistic transport gate region 62, thereby losing their energy and hence are conducted away as regular thermal electrons in the ballistic transport gate electrode 62. The remaining portion of electrons, grouped as the ballistic electrons 76a, transport across the ballistic transport gate region 62 without undergoing scattering events, and hence continue their movement along the original direction. A proper bias on the tunneling gate electrode 52 enables the ballistic electrons 76a with sufficient energy to surmount the conduction band barrier height 70 of the retention insulator 67. The carriers then enter the conduction band 68 of the retention insulator 67, making their way through and eventually being collected in the floating gate 72.

Figure 2B:
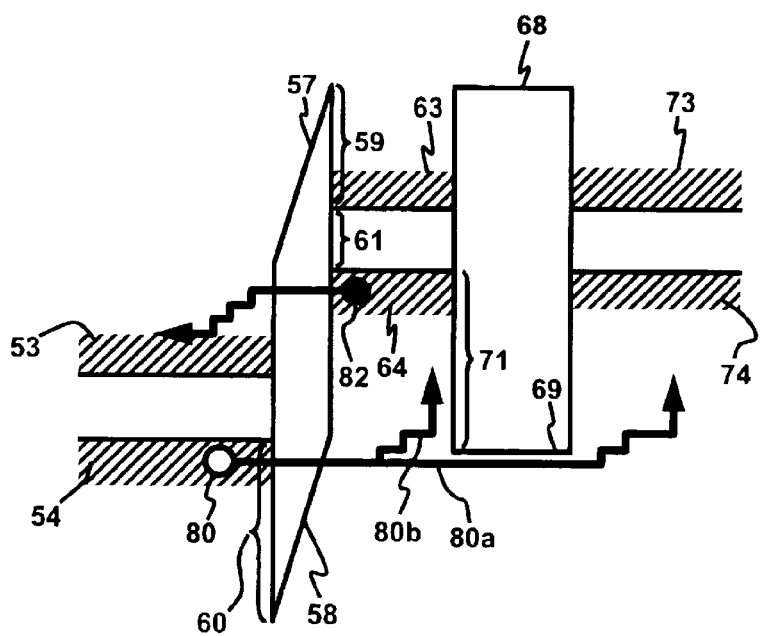
FIG. 2B is an energy band diagram for the ballistic holes injection of the present invention.

The energy band diagram for ballistic holes injection employed in memory cell operation in accordance with the present invention is illustrated in FIG. 2B, where the ballistic holes injection is shown be done by reversing the polarity of the bias applied to the tunneling gate electrode 52. Specifically, when tunneling gate electrode 52 is positively biased with respect to the ballistic-transport gate electrode 62, the valence band holes 80, which are the hole-charges in the valence band 54 of the tunneling gate electrode 52 will emanate and transport through tunneling insulator 56 through a quantum mechanical tunneling mechanism as mentioned above. A portion of the holes grouped as the scattered holes 80b experience scattering events during their transport across the ballistic transport gate region 62, thereby losing their energy and hence are conducted away as regular thermal holes in the ballistic transport gate electrode 62. The remaining portion of holes grouped as the ballistic holes 80a, transport across the ballistic transport gate region 62 without experiencing scattering events, and hence moving along the original direction till arriving at the interface between retention insulator 67 and the ballistic transport gate region 62. In the situation where ballistic holes 76a possess sufficient energy to surmount the valence band barrier height 71 of the retention insulator 67, they will then be allowed to enter the valence band 69 of the retention insulator 67, making their way through the retention insulator 67 and eventually being collected in the floating gate 72.

Figure 2C:
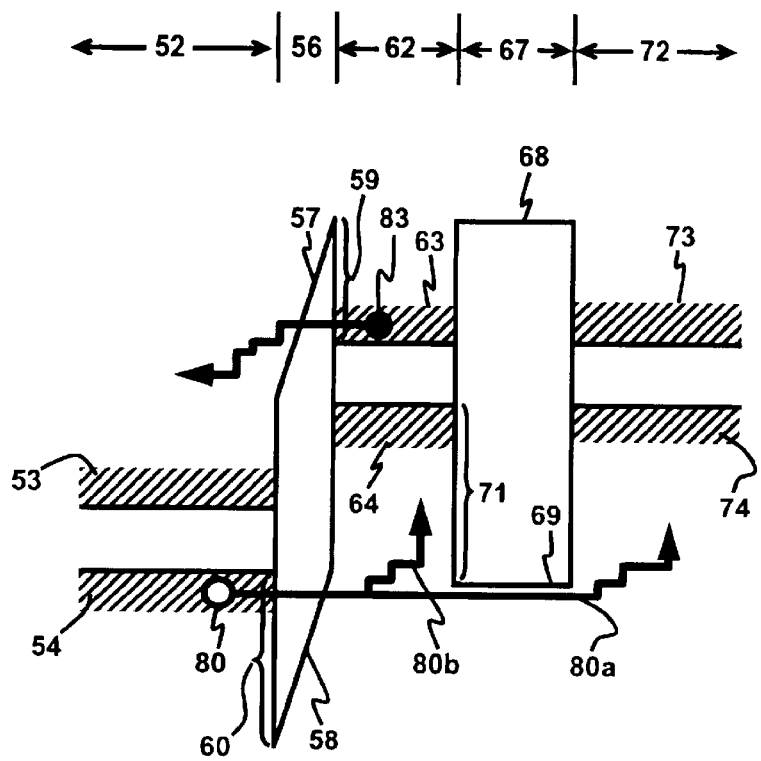
FIG. 2C is an energy band diagram for the ballistic holes injection to illustrate the adverse impact of reverse-tunneling on ballistic charge injection.
Figure 3:
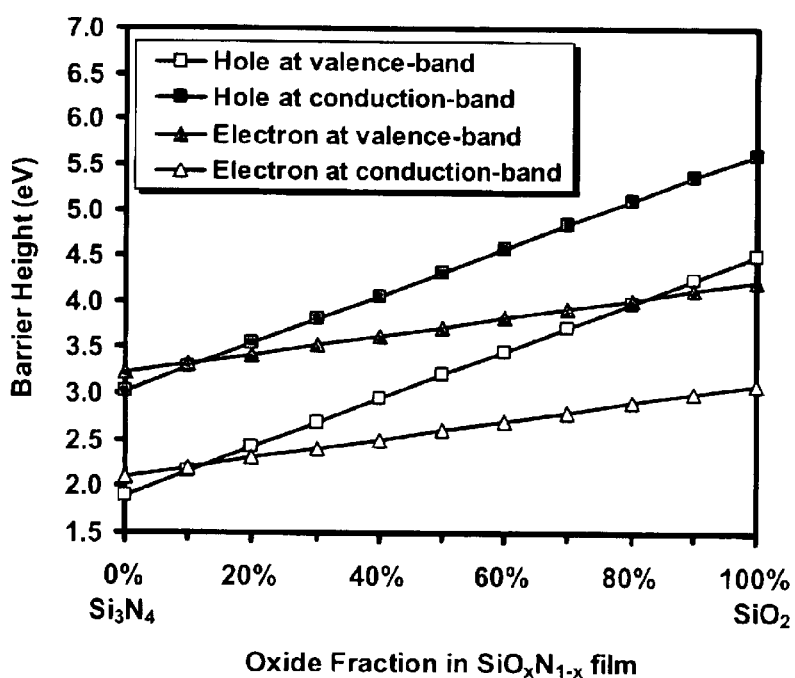

Other than illustrating the theoretical background on ballistic charge transport and its application to the present invention, FIGS. 2A and 2B also illustrate provisions on a method utilizing a same tunneling gate electrode 52 for supplying both types of ballistic charges through quantum mechanical tunneling. One tunneling gate electrode 52 for supporting both types of ballistic charges is attractive for non-volatile memory application due to a simpler structure as well as an ease on its implementation in memory cell and array, and hence an ease on their manufacturing. However, one main obstacle prohibiting the achievement on this objective is to do with the reverse tunneling phenomenon ("reverse-tunneling" hereinafter) on thermal carriers with an opposite type of charge to the ballistic carriers in the ballistic transport gate region 62. Referring to FIG. 2C for illustration on this issue, wherein an event on ballistic holes injection is shown. In the energy band diagram, a p-type and an n-type semiconductor, such as polysilicon, is used for the tunneling gate electrode 52 and for the ballistic transport gate region 62, respectively, and is used as an example illustrating the obstacle. In the situation where ballistic holes injection takes place, the conduction-band electron carriers 83 in the ballistic transport gate region 62 follow the tunneling mechanism to transport in an opposite direction as compared to the valence-band hole carriers 80, which transport in a forward direction as shown in FIG. 2C. The total current on the tunneling gate electrode 52 consists of current flows due to valence-band hole-carriers 80, which forms the forward-tunneling component, as well as due to the conduction-band electron-carriers 83, which forms the reverse-tunneling component. The forward-tunneling component is used for ballistic charge injection and is a desirable carrier flow when the ballistic charge injection mechanism is considered in memory operation. However, the reverse-tunneling component is undesirable as it has no contribution to the ballistic carrier being injected. Another undesirable effect introduced by the reverse-tunneling component is its ability limiting the forward-tunneling component from reaching a desirable current level and hence limiting the available ballistic charges for injection. For a ballistic holes injection event, the reverse-tunneling often dominates the tunneling process, and generally limits the transported ballistic hole-charges from reaching a desirable energy level. This effect is due to the fact that total current appear in the tunneling gate electrode 52 be largely dominated by the electron carrier component due to a significant lower conduction-band barrier height 59 for conduction-band electron 83 than the valence-band barrier height 60 for the valence-band holes 80. This effect is mostly significant in situation where the tunneling insulator 56 is oxide and can be further appreciated by considering the electron-current for the conduction-band electron 83, which is typically 1000 to 1,000,000 times more than the hole-current for the valence-band holes 80. As a result of this effect, the high electron current actually places a practical limit on the bias applicable across the tunneling gate electrode 52 and the ballistic transport gate region 62. It therefore limits the voltage required to support the ballistic charge transport at a value lower than desired in order to effectively utilize the ballistic transport mechanism to deliver hole-carriers 80a to the floating gate electrode 72. For example, as the bias across the tunneling gate electrode 52 and the ballistic transport gate region 62 is limited to a lower voltage value than intend, the ballistic hole-carriers will not have sufficient energy to surmount the barrier height 71 and hence will be blocked by the retention insulator 67 from reaching the floating gate electrode region 72. It is noted that for trap-free nitride film, an opposite situation, however, can exist, where ballistic electron injection can be limited by the reversely tunneled hole carriers (due to the higher conduction-band barrier height 59 for conduction-band electron 83 than the valence-band barrier height 60 for the valence-band holes 80). Regardless of the difference on effect, both cases prevent the ballistic charge injection via a same tunneling gate 52 as provided in FIG. 2C.

These effects are due to the nature of reverse-tunneling phenomenon and the high reverse-tunneling current forms obstacles on method using a single tunneling gate for injecting ballistic charges of opposite polarity. The obstacle, however, can be readily removed by choosing a p-type semiconductor material for the ballistic transport gate 62. The idea can be appreciated by referring to the provision shown in FIG. 2B. There is shown the carriers contributed to the reverse-tunneling component has been changed from the conduction band electrons 83 (shown in FIG. 2C) to the valence band electrons 82 (shown in FIG. 2B). As a result of this change, the barrier height for the reverse-tunneling electron carriers 82 has been increased by an amount equal to the energy band gap 61 of the material used for the ballistic transport gate 62. For example, if the ballistic transport gate 62 is made of a heavily doped n-type polysilicon with oxide as the tunneling insulator 56, the barrier height for electrons can be increased from about 3.1 eV to about 4.22 eV by simply replacing the n-type polysilicon with a p-type one. The barrier height 60 for valence band hole-carriers 80 in tunneling gate electrode 52 has a value of about 4.5 eV for materials used in this example. Therefore, the approach proposed herein brings the barrier height for the reverse-tunneling carriers to a range similar to that for the forward-tunneling carriers. The total current on the tunneling gate electrode 52 thus consists of approximately equally weighted current for the forward-tunneling component as well as for the reverse-tunneling component. Hence the adverse impact of reverse-tunneling on ballistic charge transport is largely minimized.

In accordance with the present invention, the provision on using p-type material such as heavily doped p-type polysilicon for both the tunneling gate electrode 52 and the ballistic transport gate 62 results in two features. First, it allows ballistic holes and ballistic electrons injection made via a same electrode. Secondly, it minimizes the adverse impact due to reverse-tunneling phenomenon on ballistic charges injection. Results shown in FIG. 3 provide a method further allowing energy band gap and barrier heights be arranged to supply ballistic charges of opposite polarity at a similar rate or current flow via a single electrode. Referring to FIG. 3, there are shown barrier heights to an insulator for electron-carriers and for hole-carriers in both conduction band and valence band of a semiconductor such as silicon or polysilicon. The barrier height is shown as a function of the fractional oxide in a dielectric film of oxynitride system ("$SiO_xN_{1-x}$"). Here, because of its well-proven manufacturing-worthy film quality and process control, the oxynitride film system is chosen as the dielectrics for illustration on the provisions. In $SiO_xN_{1-x}$, the "x" is the fractional oxide or the equivalent percentage of oxide in the oxynitride film. For example, x=1 is for case where the film is a pure oxide; similarly x=0 is for case where the film is a pure nitride. As the fractional oxide x is changed, the energy band gap changes from about 8.7 eV for a pure oxide to about 5.1 eV for a pure nitride. The methodology searching for the optimum arrangement on the dielectrics, and hence the preferable provision for supplying ballistic charges, are based on identifying carriers (electrons and holes) meeting the above two requirements. First, the carriers are with substantially identical barrier height. In addition, the carriers exist in same type of energy band (hence in same type of material, i.e. n-type or p-type). Using this methodology, only one case in FIG. 3 is identified to meet the two requirements. Referring to FIG. 3, there is shown for fractional oxide to be approximately equal to 82% (i.e. x=0.82), the barrier height for electrons at valence band is approximately identical to that for holes at valence band. Therefore, as a preferable provision in accordance with the present invention, the example here describes a tri-layers structure comprising an oxynitride film with about 82% fractional oxide placed in between two heavily doped p-type polysilicon layers. The tri-layers structure provided here enable holes or electrons tunneling across the oxynitride film at a substantially equal rate or current flow during a ballistic charge injection event where a bias of proper polarity is applied across the two polysilicon electrodes. In addition, it results in the reverse-tunneling current be similar to the forward-tunneling current for a ballistic holes injection event as well as for a ballistic electrons injection event. For example, the ratio of the reverse- and the forward-tunneling currents can be in the range of about 0.1 to about 5. Note, a second order effect due to the small difference on the effective mass between electrons and holes in the $SiO_xN_{1-x}$ dielectric might disturb the equality on their current flows achieved therein. In this case, then a small adjustment on fractional oxide in $SiO_xN_{1-x}$ film might be necessary to bring the equality relation back.

It should be appreciated by those of ordinary skill in the art that the provision on the tri-layers structure and the methodology disclosed herein to obtain the quasi-equality relation herein described is generally applicable to other type of materials and is not limited only to polysilicons or semiconductors for the tunneling gate 52 or for the ballistic transport gate 62. For example, the methodology suggested in FIG. 3 is easily extendable to metal conductors by simply replacing the curves associated with the conduction-band and the valence-band by curves associated with Fermi-levels of the metals. Additionally, the provision on the methodology disclosed herein is based on changing the insulator property (e.g. fractional oxide) to meet the two requirements stated above. It should be appreciated by those of ordinary skill in the art that the methodology is generally extendable to other approaches meeting the same requirements. For example, in the methodology disclosed herein, instead of changing the property of the insulator 56, the same requirements can be met through changing the tunneling gate 52 and the ballistic transport gate 62 to proper metal conductors. This can be done, for example, by choosing a metal material having a work function with its Fermi-level in the middle of the energy band gap of the insulator such that both type of carriers (i.e. electrons and holes) see similar barrier height. Furthermore, in this illustration the insulator used to form the tri-layers structure is in a single-layer form. It should be appreciated by those of ordinary skill in the art that the insulator can comprise more than one layer to form a composite layer. In addition, the insulator is not limited to one type of material but can comprise more than one type of insulating material to achieve the same effects as the methodology described herein. In other words, the tri-layer structure described herein can also be a multi-layers structure to reflect this effect.

It should be appreciated by those of ordinary skill in the art that the present invention is generally true for other additional effects relating to the cell operations. For example, in the present invention, ballistic electrons 76a and holes 80a can undergo additional scattering events in other regions (e.g. the retention insulator 67), and such effects can be included without affecting the scope of the present invention.

Memory Cell Operation

The operation of the memory cells will now be described below with reference to FIG. 1A.

Program

When a selected memory cell is desired to be programmed, a first type of ballistic charges (e.g. electrons) is injected into the floating gate region 20. This can be done by first applying a small voltage (e.g. 2.0 V) to its control gate region 15. A negative voltage is then applied to the tunneling gate 10 at a level where the relative difference to the control gate region 15 is in the vicinity of the voltage allowing charges to surmount the conduction band barrier height of the second layer 29. In accordance with the prefer provision disclosed in FIG. 2A and FIG. 3, a typical voltage to the tunneling gate 10 can be approximately from −2.1 to −2.5 volts. A positive voltage, on the order of about 0 to about 0.9 volts, is applied to its floating gate region 20 through voltage capacitive coupled from the drain region 22, the memory well region 40, and the source region 24. Electrons emanated from the tunneling gate region 10 will transport from the tunneling gate 10 toward the second portion 17 of the control gate 15, which serves as the ballistic transport gate region 62 (shown in FIG. 2A). As the electrons reach the second portion 17 of the control gate 15, they will transport at a high energy with most of them being able to transport through this region through the ballistic transport mechanism, which preserves their energy while reaching the interface between the region of second portion 17 and the insulating layer 29. The high energy allows the electron carriers surmounting the barrier height of the insulator 29, moving into and transporting through it and onto the floating gate 20. The ballistic transport is usually made possible by controlling the thickness of the second portion 17 of the control gate 15 to a range similar to or thinner than the electron mean-free-path of the material in that region. Ground potential is applied to the source regions 24 and drain regions 22 for memory cell rows and columns not containing the selected memory cell. Ground potential is applied to the control gates 15 for memory cell rows not containing the selected memory cell. Thus, only the memory cell in the selected row and column is programmed.

The injection of electrons onto the floating gate 20 will continue until a blocking effect on the ballistic electrons taking place. The blocking effect is due to the rising of the energy bands in the floating gate 20, which is equivalent to the lowering of the floating gate potential as electron charges accumulated thereon. As a result, a triangle energy barrier in the insulator 29 is formed and will continue to increase as more ballistic electrons are injected into and accumulated on the floating gate 20. The reduced charge on the floating gate 20 will decrease the electron flow from the tunneling gate 10 onto the floating gate 20 until to a point the barrier height is high enough to completely block ballistic electrons transport thereunto. The charge blocking mechanism is highly voltage-sensitive. In other words, its current dependence on voltage is more sensitive than that usually observed in the Fowler-Nordheim tunneling. Further, the insulator 29 is typically with thickness of about 80 angstrom or thicker, where the voltage-less-sensitive charge tunneling, namely the direct-tunneling phenomenon, is not permitted. These effects provide an effective self-limiting mechanism for ballistic charge injection. Furthermore, it provides a method permitting charges be injected onto floating gate at a fine incremental level through incrementally adjusting the bias at regions (such as the drain 22) adjacent to the floating gate 20. The mechanism thus permits multi-level states storage.

More details describing the self-limiting mechanism and its implication on cell design and theory of operation will be provided hereinafter.

Erase

The erase of a selected memory cell is typically done by reversing the polarity of the bias applied to each of the nodes shown in the program operation. Specifically, a second type of ballistic charges (e.g. holes) is injected into the floating gate region 20. This can be done by first applying a small voltage (e.g. −2.0 V) to its control gate region 15. A positive voltage is then applied to the tunneling gate 10 at a level where the relative difference to the control gate region 15 is in the vicinity of the voltage allowing hole-charges to surmount the valence band barrier height of the second layer 29. In accordance with the prefer provision disclosed in FIG. 2A and FIG. 3, a typical voltage to the tunneling gate 10 can be on the order of approximately +2.1 to +2.5 volts. Then a negative voltage, on the order of 0 to −0.9 volts, is applied to its floating gate region 20 through voltage capacitive coupled from the drain region 22, the memory well region 40, and the source region 24. Under the bias condition, holes on the tunneling gate 10 are induced through quantum mechanical tunneling mechanism to tunnel through the second portion 34 of the third insulator layer 36. As the holes reach the second portion 17 of the control gate 15, they will transport at a high energy with portions of them being able to transport through this region in the ballistic transport mechanism, which preserve their energy while reaching the interface between the region of second portion 17 and the insulating layer 29. The high energy allows hole-carriers surmounting the valence-band barrier height of insulator 29, moving into and transporting through it and onto the floating gate 20, neutralizing the electron charges therein. The ballistic hole carriers will continue making their way in and eventually leaving the floating gate 20 be positively charged before a self-limiting mechanism taking place. The self-limiting mechanism for hole carriers is a similar one as in the program operation for electron charges. The ballistic hole transport efficiency, defined as the ratio of the holes reaching the floating gate 20 to the holes emanating from the tunneling gate 10, can be generally enhanced by controlling the film thickness of the second portion 17 of the control gate 15 to a range similar to or thinner than the mean-free-path of hole carriers in the second portion 17 of the control gate 15. Ground potential is applied to the source regions 24 and drain regions 22 for memory cell rows and columns not containing the selected memory cell. Ground potential is applied to the control gates 15 for memory cell rows not containing the selected memory cell. Thus, only the memory cell in the selected row and column is erased.

For memory cells in accordance with the present inventions, it should be noted that both program and erase operations can be done with absolute bias at a level less than or equal to 2.5V. Furthermore, the erase mechanism and cell architecture enable the individually erasable cells feature, which is ideal for storing data such as constants that required periodically changed. The same feature is further extendable to small group of such cells which are erased simultaneously (e.g. cells storing a digital word, which contains 8 cells). Additionally, the same feature is also further extendable to such cells which are erasable simultaneously in large group (e.g. cells storing code for software program, which can contain 2048 cells configured in page, or contain a plurality of pages in block in array architecture).

Finally, to read a selected memory cell, ground potential is applied to its source region 24. A read voltage of approximately +1 volt is applied to its drain region 22 and approximately 2.5 volts (depending upon the power supply voltage of the device) is applied to its control gate 15. Other regions (i.e. source 24 and memory well 40 regions) are at ground potential. If the floating gate 20 is positively charged (i.e. the floating gate is discharged of electrons), then the channel region 21 (along the trench sidewall 31 adjacent the floating gate 20) is turned on. Thus, an electrical current will flow from the source region 24 to the drain region 22. This would be the "1" state.

On the other hand, if the floating gate 20 is negatively charged, the channel region 21 is either weakly turned on or is entirely shut off. Even when the control gate 15 and the drain region 22 are raised to the read potential, little or no current will flow through channel region 21. In this case, either the current is very small compared to that of the "1" state or there is no current at all. In this manner, the memory cell is sensed to be programmed at the "0" state. Ground potential is applied to the source regions 24, drain regions 22, and control gates 15 for non-selected columns and rows so only the selected memory cell is read. For both selected and non-selected memory cells, ground potential is applied to the memory well region 40.

The memory cell can be formed in an array with peripheral circuitry including conventional row address decoding circuitry, column address decoding circuitry, sense amplifier circuitry, output buffer circuitry and input buffer circuitry, which are well known in the art.

The cell operation and the memory cell architecture of the present invention is advantageous because it does not require high voltages (e.g. 2.5V or higher) for cell operations, and hence remove requirements on high-voltage infrastructures outlined earlier and avoid issues therein. Another important feature of the present invention is the provision of a tunneling gate 10 atop a second portion 17 of a control gate 15 with a floating gate 20 underlying the overlap between regions 10 and 17. The provision allows a charge injection scheme where electrons or holes can be emanated from a tunneling gate 10 above the silicon substrate and are transported along a downward direction into floating gate 20 thereunder.

The "top-down" injection scheme in the present invention provides a main advantage over conventional arts. First, the program efficiency is greatly enhanced by "aiming" the ballistic charge carriers at the floating gate 20. In conventional programming schemes, the electrons transport along the channel region in a path parallel to the floating gate, where a relatively small number of the electrons become heated and are injected onto the floating gate. The program efficiency (number of charges injected compared to total number of charges supplied) is estimated at about $1/1000$ to about $1/1,000,000$. However, in the present invention, because the "topdown" injection scheme, high energy carriers are 'aimed' directly at the floating gate, the program efficiency is estimated to be closer to $1/10$, where almost most of the charges are injected onto the floating gate. Secondly, through out the cell operations, the highest voltage (e.g. 2.5V) appears only to regions above the silicon surface level (such as the control gate region 15 and the tunneling gate region 10). In other words, none of the regions under the silicon surface where metallurgical junctions are involved (e.g. source regions 24 and drain regions 22) will ever experience the highest voltage provided in the cell operations. This is because in the present invention, both source regions 24 and drain regions 22 have a principle role on the read operation, which is performed at a relative low voltage. Though the two regions involved in program and erase operations, their role are primarily to couple a small amount of voltage (~0 to 1V) to the floating gate 20, and have no involvement whatsoever on high voltage effect such as generating or supplying high energy carriers.

Being able to keep regions with metallurgical junctions at a relative low voltage through out the cell operations provides a unique feature to the present invention. The feature not only provides a significant advancement over prior arts, but brings several additional advantages hereto. First, the scaling constraints on cell height as outlined hereinbefore is removed, therefore further scaling on cell dimension using more aggressive design rule is possible. Memory cell size is reduced by as much as 50% because the floating gate region 20 is buried inside the substrate 51 and because of the low voltage at drain regions 22. Cell areas of approximately 0.21 $\mu m^2$ and 0.11 $\mu m^2$ can be achieved by the present invention using 0.18 $\mu m$ and 0.13 $\mu m$ technology generations, respectively, with further reduction possible. Secondly, the hot carrier effect associated with a metallurgical junction field and its degradation and damage to the insulator 45 adjacent thereto are avoided. This is in a clear contrast to the damage effect in prior arts, where cell programming is done by heating up electrons through applying a high voltage at one of the junctions, which inevitably introduces high field across insulator adjacent to the floating gate and results in damage therein. Furthermore, due to the relatively smaller difference on voltage between the floating gate 20 and its surrounding regions (e.g. drain 22), the field stress effect on the insulator 45 therebetween are largely suppressed. This advantage is of particular importance to charge retention and reliability for nonvolatile memory cells.

Cell Disturb

As memory cells 100a are placed in an array environment, cell state can be unintentionally changed during the useful lifetime of usage due to cumulative disturbance introduced while conducting cell operations (i.e. program, erase, and read) throughout other cells that are within a same memory array. The present invention provides memory cells immune to this issue. For example, for electrons or holes to surmount the barrier height of the insulator 45, which is adjacent to the floating gate 20 and the drain region 22, the carriers have to be heated up by the junction field of a drain region 22 to a kinetic energy higher than the barrier height (about 3.1 eV for electrons and 4.6 eV for holes) of the insulator 45. Being able to keep relatively low voltage (e.g. about 2.0 to about 2.5V) at the drain 22 (and other electrodes with metallurgical junctions) enable the present invention to effectively prevent electrons or holes gaining energy higher than the barrier height of the insulator 45. In other words, in terms of disturb by a junction field, the bias scheme provided herein produces negligible disturb on non-selected cells during an erase, a read or a program operation on a selected cell.

Additionally, the ballistic charge injection scheme in memory cells of the present invention also exhibits greatly decreased cell-disturb effect. There are several cases can be considered to demonstrate this effect. First, the worse case of a read disturb condition happens as the floating gate 20 is in an erase state (i.e. the floating gate 20 is in a neutral or a positively charged state). Under this condition, a small amount of ballistic electrons, which are induced by the control gate 15, can transport through the second portion 17 of the control gate 15 to arrive at the interface between region 17 and insulator 29. However, those electrons will not be able to surmount the barrier height thereat (about 4 eV) due to the fact that their energy is limited by the relative lower bias (about +2V) between the control gate 15 and the tunneling gate 10 during a read operation. As a result, the carriers will be blocked from reaching the floating gate 20, thereby having no effects whatsoever on the charge state therein. Secondly, the worse of an erase disturb condition can happen as the floating gate 20 is in a program state (i.e. the floating gate 20 is in a negatively charged state). Under this condition, a small amount of ballistic holes, which are induced by the control gate 15, can transport through the second portion 17 of the control gate 115 to arrive at the interface between region 17 and insulator 29. However, similar to the ballistic electrons in the first case, those holes will not be able to surmount the barrier height thereat (about 4 eV) due to the fact that their energy is limited by the relative lower bias (about 2V) between the control gate 15 and the tunneling gate 10 during an erase operation. As a result, the hole-carriers will be blocked from reaching the floating gate 20, thereby having no effects whatsoever on the charge state therein.

Furthermore, the memory cell of the present invention exhibits greatly reduced cell disturb that caused by the capacitive coupling on voltage drop across the insulator 29. The worse condition on cell disturb due to this effect is for memory cell with floating gate 20 in the programmed state (i.e. floating gate negatively charged). Since the cell 100a is designed with an equally distributed capacitive coupling between the floating gate 20 and other electrodes (e.g. drain 22, source 25 etc), the capacitive coupling between the control gate 15 and the floating gate 20 is about 20%. This effect in together with the lower voltage on the control gate 15 during a read operation, can result in a voltage drop between the floating gate 20 and the control gate 15 be as low as 1.5 to 2.5V, where charge leakage through Fowler-Nordheim tunneling is negligible.

Overview the disturb effects and mechanisms outlined herein, in general, both the cell operation conditions and the cell capacitances of memory cell hereof can be optimized through cell design such that the disturb effects on floating gate charges during the lifetime usage of a memory product be kept at a level low enough to prevent flipping cell state from a "0" state to a "1" state or vice versa.

Self-Limiting Ballistic Charge Injection on Memory Cell Operation

Further description on the self-limiting mechanism and its usage on cell design and cell operation will now be provided using a simple capacitance model. The floating gate 20 is approximately at a potential given by the following equation:

$$V_{FG} = (Q_{FG} + \Sigma C_i V_i)/C_{total}$$

with $$\Sigma C_i V_i = C_{FG-S} * V_S + C_{FG-D} * V_D + C_{FG-CG} * V_{CG} + C_{FG-W} * V_W$$

and $$C_{total} = C_{FG-S} + C_{FG-D} + C_{FG-CG} + C_{FG-W},$$

where $Q_{FG}$ is the total injected charges (electrons or holes) accumulated on the floating gate 20;

$C_{FG-S}$ is the capacitance between the floating gate 20 and the source region 24;

$C_{FG-D}$ is the capacitance between the floating gate 20 and the drain region 22;

$C_{FG-CG}$ is the capacitance between the floating gate 20 and the second portion 17 of the control gate 15;

$C_{FG-W}$ is the capacitance between the floating gate 20 and the memory well region 40.

In the situation where a cell is free of any charge in its initial state, the floating gate potential can be approximated by $$V_{FG\_i} = \Sigma C_i V_i / C_{total}$$

Program Operation

Figure 4A:
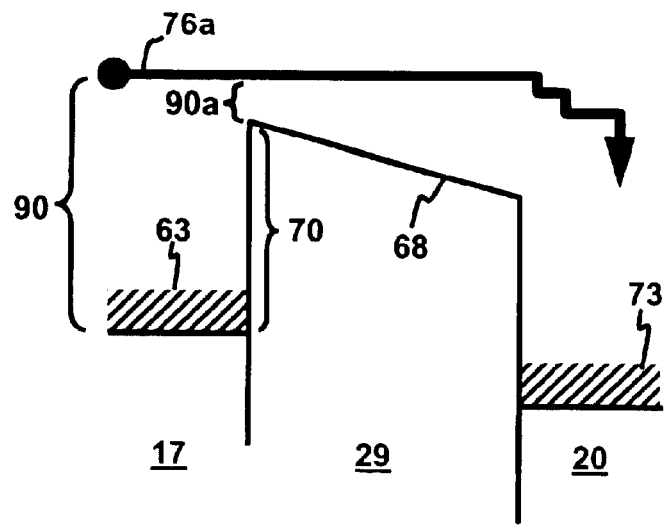
FIG. 4A is an energy band diagram for a floating gate at initial stage of a program operation illustrating the self-limiting program mechanism in the present invention

Self-limiting injection mechanism is illustrated for program operation when a first type of charges (e.g. electrons) is selected as the ballistic carriers. Referring to FIG. 4A, there is shown a partial portion of the conduction energy band diagram presented in FIG. 2A for a floating gate potential at its initial state as ballistic electrons transporting across the second portion 17 of the control gate 15. In FIG. 4A, the second portion 17 of the control gate 15 serves the ballistic transport gate 62 function shown in FIG. 2A. Also, the floating gate electrode 72 in FIG. 2A is now translated to the floating gate 20 in memory cells of the present invention. The ballistic electrons 76a are shown transporting with a kinetic energy 90 that is sufficient to surmount the conduction band barrier height 70 of the retention insulator 29. In the illustration provided here, the kinetic energy 90 of ballistic carriers 76a is shown higher than the barrier height 70 by an amount 90a to surmount the barrier 70. The carriers then enter the conduction band 68 of the retention insulator 29, making their way through and eventually being collected in the floating gate 20. Through the injection process, negative charges will gradually build up on the floating gate 20, and subsequently modify the floating gate potential and hence the electric field in the insulator 29. As injection continues, this effect can change the direction of electric field from one assisting the charge transport (e.g. FIG. 4A) to the other opposing the charge transport (e.g. FIG. 4B).

Figure 4B:
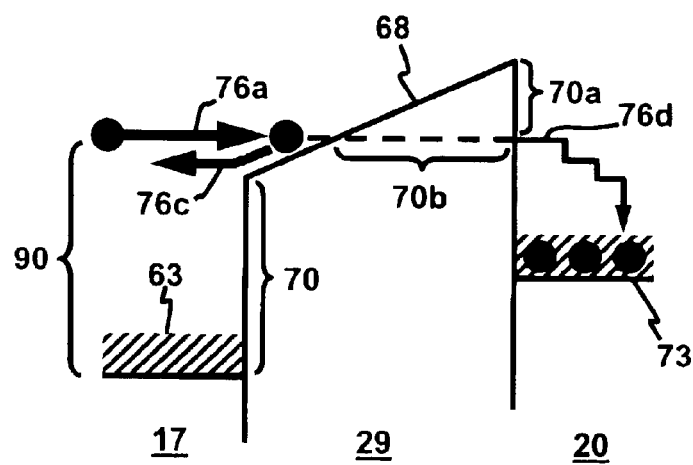
FIG. 4B is an energy band diagram for a floating gate at a final stage of a program operation illustrating the self-limiting program mechanism in the present invention.

Referring to FIG. 4B, there is shown an energy band diagram similar to that in FIG. 4A with a major difference on the floating gate potential. Here the floating gate potential has been modified from its initial state after negative charges built up thereon. As the event on charge injection continue, the ballistic electrons 76a transporting with same energy 90 is now shown be reflected back towards the second portion 17 of the control gate 15 to become carriers 76c, and can be conducted away therein as thermal carriers. It is further shown that these electrons 76a are only able to enter the conduction band 68 of a portion of the retention insulator 29 but unable to surmount the conduction band barrier height 70a in the retention insulator 29. There is shown further yet a small portion of carriers can reach the floating gate 20 through quantum mechanical tunneling to tunnel through a distance 70b and finally become the electron carriers 76d reaching the floating gate and reside thereon. However, the tunneling probability for carriers 76d is generally very low (e.g. about a millionth), and is expected to decrease rapidly as described hereinafter. With these effects, the accumulated charges on the floating gate induce a mechanism to limit the incoming ballistic carriers from continuing reaching the floating gate 20. The illustration shown in FIG. 4B provides the basis for the self-limiting mechanism disclosed in this invention. The voltage dependence of flow rate for the electron carriers 76d can be more sensitive than that seen in Fowler-Nordheim tunneling. There are several reasons for this. First, the retention insulator 29 is provided with a thickness on the order of about 60 angstrom or thicker, and thus is considered as a Fowler-Nordheim tunneling dielectrics. Therefore, without considering other effects, the voltage dependence of flow rate for electron carriers 76d is similar to that in Fowler-Nordheim tunneling characteristics, where a strong current dependence on voltage is seen (particularly at lower voltage range, e.g. a typical value is about 1 order of magnitude of current change for about every 100 mV voltage change). Secondly, as charges constantly built up on floating gate 20, the energy barrier in insulator 29 is increased accordingly to develop an opposing field E, and becomes more effective on opposing the incoming ballistic carriers 76a. The opposing field E can be approximated by $$E = (Q_{FG} - Q_{FG\_fb}) / (T_{insulator} C_{total})$$

where $Q_{FG\_fb}$ is the charges on the floating gate as insulator is at flat band condition;

$T_{insulator}$ is the thickness of the insulator 29.

The opposing barrier height $\phi_e$ (i.e. the conduction band barrier height 70a seen by the ballistic electron carriers in the retention insulator 29) can be approximated by $$\phi_e = q(Q_{FG} - Q_{FG\_fb}) / C_{total} - \Delta K_e$$

where $\Delta K_e$ is the energy difference 90a between the electron-carrier kinetic energy 90 and the barrier height 70 at the interface of insulator 29; and q is the electron unit charge.

Therefore, in the situation where $\phi_e$ is less than zero (i.e. $\Delta K_e$ being greater than $q(Q_{FG} - Q_{FG\_fb})/C_{total}$), the ballistic charges are permitted to transport through the insulator 29, and the effect of opposing field on blocking the incoming ballistic charges is negligible. As injection continue till a situation where $\phi_e$ equals to zero (i.e. $\Delta K_e$ being equal to $q(Q_{FG} - Q_{FG\_fb})/C_{total}$), the effect of opposing field takes place to block incoming ballistic charges. With injection further continues, the barrier height 70a seen by the ballistic electron carriers in the retention insulator 29 start to form and can continue to increase as more negative charges build up on the floating gate 20. Along with the effect, the rejected carriers 76c are expected to increase rapidly to become equal to the incoming carriers 76a. As a result, it reduces the amount of carriers available to participate the Fowler-Nordheim tunneling and hence effectively reduces the tunneling carriers 76d to reach the floating gate 20. This mechanism further increases the voltage effect on suppressing the charge movement to the floating gate 20.

Both the effects outlined above forms the self-limiting injection mechanism for cell programming using ballistic charge injection. In the initial program stage, so long as the ballistic electron carriers can surmount the barrier height 70, the charges are allowed to transport through the insulator 29 and reach the floating gate 20. As program event continues, electron charges will continue build up on the floating gate 20, the potential on the floating gate 20 will decrease to reach a lower value $V_{FG\_P}$ such that a new barrier 70a is now formed to block all incoming ballistic carriers from further reaching the floating gate 20. This then complete a programming cycle, in which the programming event ends as the self-limiting mechanism take place.

At the completion of a programming event, the total amount of charges on the floating gate 20 can be approximated by a simple equation shown as below:

$$Q_{FG} = C_{total}(V_{FG\_P} - V_{FG\_i}).$$

In a different form, the total charges can be expressed approximately as:

$$Q_{FG} = Q_{FG\_fb} + (C_{total}/q) * \Delta K_e$$

Therefore, at the end of a programming cycle, the total charges accumulated on the floating gate 20 are determined by two major parameters. First, it's determined by the extra energy 90a that is over the barrier height 70 for the ballistic carriers 76a. Since the extra energy 90a is set by the voltage difference between the tunneling gate 10 and the second portion 17 of the control gate 15, a selection on the bias between regions 10 and 15 hence determines the amount of charges stored on floating gate 20. The total cell capacitance $C_{total}$ has a scaling effect and can be optimized through cell design to assist the effect herein. For example, a smaller value for the total cell capacitance will result in the need on a larger bias between regions 10 and 15 for injecting a same amount of charges onto the floating gate 20. The second parameter determining the total floating gate charges is to do with the floating gate charges yielding the flat band condition in the insulator 29, which in turn is set by the voltages applied to each electrodes of the memory cell as well as the capacitor components of corresponding electrodes. Thus with a choice on a set of these parameters, the present invention allows the memory cells be programmed to a state a priori. The linearly dependence of $Q_{FG}$ on $\Delta K_e$ (i.e. the extra energy 90a) further provide an advantage to the present invention to allow memory cells stored with multi-level states a priori.

Erase Operation

Figure 4C:
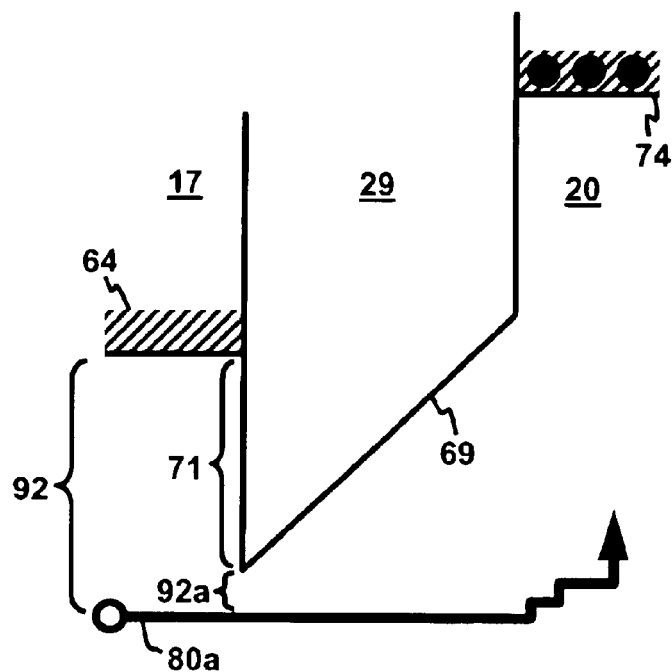
FIG. 4C is an energy band diagram for a floating gate at initial stage of an erase operation illustrating the self-limiting erase mechanism in the present invention.

Self-limiting injection mechanism is further provided for erase operation when a second type of charges (e.g. holes) is selected as the ballistic carriers. Referring to FIG. 4C, there is shown a partial portion of the valence energy band diagram presented in FIG. 2B for a floating gate with potential at its initial state where a first type of charges (e.g. electrons) reside therein. In FIG. 4C, the second portion 17 of the control gate 15 serves the function of ballistic transport gate 62 shown in FIG. 2B. Also, the floating gate electrode 72 in FIG. 2B is now translated to the floating gate 20 in the memory cell of the present invention. The ballistic holes 80a are shown transporting across the second portion 17 of the control gate 15 with a kinetic energy 92 that is sufficient to surmount the valence band barrier height 71 of the retention insulator 29. In the illustration provided herein, the kinetic energy 92 of ballistic hole-carriers 80a is shown higher than the barrier height 71 by an amount 92a. The carriers then enter the valence band 69 of the retention insulator 29, making their way through and eventually being collected in the floating gate 20. Through the injection process, positive charges will gradually build up on the floating gate 20, and subsequently modify the floating gate potential and hence the electric field in the insulator 29. As injection continues, this effect can change the direction of electric field from one assisting the charge transport (e.g. FIG. 4C) to the other opposing the charge transport (e.g. FIG. 4D).

Figure 4D:
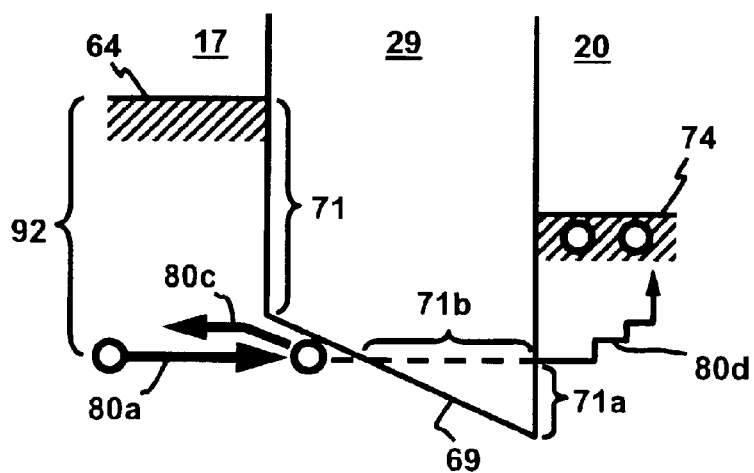
FIG. 4D is an energy band diagram for a floating gate at final stage of an erase operation illustrating the self-limiting erase mechanism in the present invention.

Referring to FIG. 4D, there is shown an energy band diagram similar to that in FIG. 4C with a major difference on the floating gate potential. Here the floating gate potential has been modified from its initial state where initial electrons have been neutralized and positive charges have been built up. As the event on charge injection continue, the ballistic holes 80a transporting with same energy 92 is now shown be reflected back towards the second portion 17 of the control gate 15 to become carriers 80c, and can be conducted away therein as thermal carriers. It is further shown these carriers are only able to enter the valence band 69 of a portion of the retention insulator 29 but unable to surmount the valence band barrier height 71a in the retention insulator 29. Among these holes 80a, it is shown further yet a small portion of them can reach the floating gate 20 through quantum mechanical tunneling to tunnel through a distance 71b. They finally become the hole-carriers 80d in the floating gate and reside therein. However, the tunneling probability for carriers 80d is generally very low, and is expected to decrease rapidly as described hereinafter. With these effects, the accumulated charges on the floating gate induce a mechanism to limit the incoming ballistic hole-carriers from continuing reaching the floating gate 20. The illustration shown in FIG. 4D provides the basis for the self-limiting mechanism for erase operation disclosed in this invention. The voltage dependence of flow rate for the hole-carriers 80d can be more sensitive than that seen in Fowler-Nordheim tunneling. There are several reasons for this. First, the retention insulator 29 is provided with a thickness on the order of about 60 angstrom or thicker, and thus is considered as a Fowler-Nordheim tunneling dielectrics. Therefore, without considering other effects, the voltage dependence of flow rate for hole-carriers 80d is similar to that in Fowler-Nordheim tunneling mechanism. Secondly, as charges constantly built up on floating gate 20, the energy barrier in insulator 29 is increased accordingly to develop an opposing field E, and becomes more effective on opposing the incoming ballistic hole-carriers 80a. The opposing field E can be approximated by $$E=(Q_{FG}-Q_{FG\_fb})/(T_{insulator}C_{total})$$

where $Q_{FG\_fb}$ is the charges on the floating gate as insulator is at flat band condition;

$T_{insulator}$ is the thickness of the insulator 29.

The opposing barrier height $\phi_h$ (i.e. the valence band barrier height 71a seen by the ballistic hole-carriers in the retention insulator 29) can be approximated by $$\phi_h = q(Q_{FG}-Q_{FG\_fb})/C_{total}-\Delta K_h$$

where $\Delta K_h$ is the energy difference 92a between the hole-carrier kinetic energy 92 and the barrier height 71 at the interface of insulator 29; and q is the electron unit charge.

Therefore, in the situation where $\phi_h$ is less than zero (i.e. $\Delta K_h$ being greater than $q(Q_{FG}-Q_{FG\_fb})/C_{total}$), the ballistic charges 80a are permitted to transport through the insulator 29, and the effect of opposing field on blocking the incoming ballistic charges is negligible. As injection continue till a situation where $\phi_h$ equals to zero (i.e. $\Delta K_h$ being equal to $q(Q_{FG}-Q_{FG\_fb})/C_{total}$), the effect of opposing field takes place to block incoming ballistic charges. With injection further continue, the barrier height 71a can continue to increase as more positive charges build up on the floating gate 20. Along with the effect, the rejected hole-carriers 80c are expected to increase rapidly to become equal to the incoming carriers 80a. As a result, it reduces the amount of carriers available to participate the Fowler-Nordheim tunneling and hence effectively reduces the tunneling carriers 80d to reach the floating gate 20. This mechanism further increases the voltage effect on suppressing the charge movement to the floating gate 20.

Both the effects outlined herein forms the self-limiting mechanism for the erase operation. In the initial erase stage, so long as the energy of the ballistic hole-carriers can surmount the barrier height 71, the charges are allowed to transport through the insulator 29 and reach the floating gate 20. As total electron charges on floating gate are fully neutralized by injected holes, positive charges start building up on the floating gate 20 to increase the potential on the floating gate 20 to a higher value $V_{FG\_E}$ such that a new barrier 71a is formed to effectively block all incoming ballistic hole-carriers from further reaching the floating gate 20. This then complete an erase cycle, in which the event ends as the self-limiting erase mechanism take place.

At the completion of an erase cycle, the total charges on the floating gate 20 can be approximated by a simple equation shown as below:

$$Q_{FG}=C_{total}(V_{FG\_E}-V_{FG\_i}).$$

In a different form, the total charges can be expressed approximately as:

$$Q_{FG}=Q_{FG\_fb}+(C_{total}/q)*\Delta K_h$$

Therefore, at the end of an erase cycle, the total hole-charges accumulated on the floating gate 20 are determined by two major parameters. First, it can be determined by the extra energy 92a that is over the barrier height 71 for the ballistic holes 80a. Since the extra energy 92a is set by controlling the voltage difference between tunneling gate 10 and second portion 17 of the control gate 15, a selection on the bias between regions 10 and 15 hence determine the amount of charges stored on floating gate 20. The total cell capacitance $C_{total}$ has a scaling effect here and can be optimized through cell design to assist the effect herein. For example, a larger value for the total cell capacitance will enable using a smaller bias between regions 10 and 15 for injecting a same amount of charges onto the floating gate 20. The second parameter determining the total floating gate charges is to do with the floating gate charges yielding the flat band condition in the insulator 29, which in turn is set by the voltages appeared at each electrodes of the memory cell as well as the capacitor components of corresponding electrodes. Thus with a choice on a set of these parameters, the present invention allows the memory cells be erased to a state a priori. Furthermore, the linear dependence of $Q_{FG}$ on $\Delta K_h$ (i.e. the extra energy 92a) provides an advantage to the present invention to allow memory cells be erased to a state a priori. Both of these effects can be used to prevent over-erase issue in non-volatile memory cells in the prior arts.

It should be appreciated by those of ordinary skill in the art that the provision disclosed herein on the self-limiting mechanism is generally true for operating cells using either type of charges. For example, hole-charges can be selected for program operation and electrons can be selected for erase operation.

Method of Manufacturing

Figure 5A:
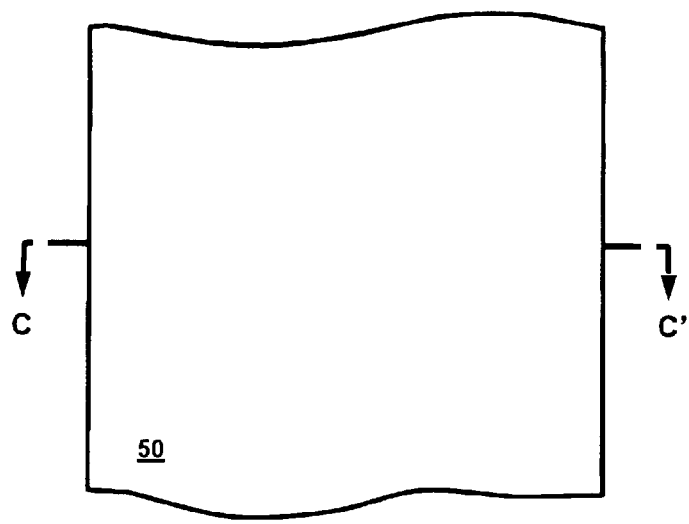
FIG. 5A is a top view of a semiconductor substrate used in the first step of the method of manufacturing memory cell in present invention.
Figure 5B:
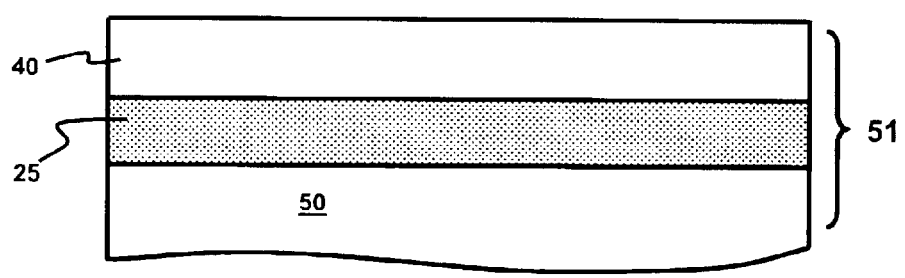
FIG. 5B is a cross sectional view of the structure taken along the line CC' showing the initial processing steps of the present invention.

Referring to FIG. 5A there is shown a top plan view of a bulk material 50, which is preferably silicon of a first conductivity (e.g. P-type) and is well known in the art. A first semiconductor layer 40 of the first conductivity type with a higher doping level than the bulk material 50 is formed thereupon as shown in FIG. 5B. The first semiconductor layer 40 forms the memory well where memory cell reside, and can be formed in the bulk material 50 by well known techniques such as ion implantation, which introduces impurity into the bulk material 50. The memory well 40 also can be formed atop of the bulk material 50 by well known techniques such as epitaxial deposition (e.g. chemical vapor deposition CVD), which deposits preferably a doped single crystalline silicon on the bulk material 50. Thereafter, a heavily-doped first region 25 of a second conductivity type (preferably n-type) is formed in between layer 40 and bulk material 50 by well known techniques such as ion implantation. While not shown, an optional photo-resist layer can be formed prior the implantation to serve as a mask defining one or more first regions 25 where impurity are implanted into. The first regions 25 form the buried source lines of the memory array with the source region 24 of each individual cell connected thereto. The region can be with majority of its portion in the bulk material 50 or in the memory well 40, and the process sequence on forming the first layer (or the memory well) 40 and the buried source lines 25 can be in reverse order.

Once the memory well 40 and the buried source lines 25 have been formed, a heavily doped n-type junction is formed with junction traces oriented in a first direction (i.e. the Y or column direction). These junction traces form the drain lines 23 of the memory array where the drain regions 22 of each memory cell are connected thereto. The junction traces can be formed by employing conventional techniques such as photo-lithography and ion implantation. For example, the n-type junction can be formed by suitably applying a photo-resistant material ("photo-resist" hereinafter) on the silicon surface followed by a masking step to selectively remove the photo-resist leaving opening regions oriented in a first direction. Thereupon, an n-type impurity (e.g. Arsenic) is implanted at a low energy (e.g. 5 keV) and high dosage (e.g. 5E15 $cm^{-3}$) through conventional ion implantation technique into silicon regions uncovered by the photo-resist to forms the drain lines 23. The structure is further processed by stripping the photo-resist followed by implanting a p-type impurity (e.g. boron) at medium or lower range of dosage (e.g. about 1E14 $cm^{-3}$) to form field-inversion stopper regions 26. The inversion stopper regions 26 are preferably formed with its peak concentration located in the vicinity of the silicon surface and the region thus formed should be shallower than the drain regions 22 of the drain lines 23. Thus, at this point, the substrate 51 has alternating stripes of drain diffusion regions 22 and inversion stopper regions 26. The stripes of drain diffusion regions 22 define the active regions 4 for individual memory cell, whereas the stripes of inversion stopper regions 26 define the isolation regions 5 isolating memory cells on different column. The width of the drain line stripes 23 and the distance between adjacent stripes can be as small as the smallest lithographic feature of the process used. The process is further continued by forming an insulator 30 (preferably oxide with 500–1000 Å thick) using well known techniques such as oxidation or deposition (e.g. chemical vapor deposition or CVD). The structure thus formed is shown in FIGS. 6A through 9A.

A photo-resist 7 is formed over the insulator 30, followed by a masking step to define and selectively remove photo-resist leaving a plurality of circular shape openings 32a to expose the top of insulator oxide 30. Each column of the openings 32a is preferably aligned to the center of each of the drain line 23. An oxide etch step follows thereafter to remove the insulator oxide 30 uncovered by the photo-resist 7. Using the same photo-resist as etching mask, a silicon-etch step follows thereafter to form a plurality of trenches 32 in the substrate 51 by well-known dry etch technique (e.g. RIE). The patterns of the photo-resist openings 32a are imaged to the substrate to define patterns for the trench openings 32b. Due to the nature of dry etching technique, the patterns openings 32a and 32b are substantially identical to each other with the opening boundaries substantially overlapping each other. The etching continues into the substrate 51 to a predetermined depth to form trenches with a depth reaching through the well layer 40 wherein the trench bottom 33 is submerged partially into the buried source regions 25. At this step, due the nature of the dry-etch, the photo-resist 7 can have openings 32c wider than the original 32a by a distance $\Delta W$. With the photo-resist 7 in place, optional self-aligned ion implantations of n-type impurity (e.g. arsenic) can be made to dope the regions under and adjacent the trench bottom 33. The same implant can also be used to dope the drain region 22 surrounding the trench openings 32b, thereby forming self-aligned drain regions 22. This has the advantage to ensure the drain regions 22 of individual cell be connected to the drain lines 23 of a memory array even in the situation where trench holes 32b are not centered in the drain lines 23 due to misalignment. An additional ion implantation (preferably at a larger angle) can be further used to dope region adjacent the trench sidewall 31, thereby adjusting the threshold voltage in regions where the channels 21 of the memory cell reside. The resulted structure is shown in FIGS. 6B through 9B. The trench sidewall 31 thus formed can be vertical to the silicon surface (for memory cell 100a) or with a tilted angle (for memory cell 100b). In FIG. 6B, the top view of the trench openings 32b is shown in a circular shape, and can be in other shapes (e.g. rectangular, square etc) pending on the photo-resist patterns 32a.

The remaining photo-resist 7 is then removed using conventional means. The process is followed by forming a high quality liner oxide 28 on top of the structure. The oxide formed adjacent to the trench side wall 31 is the trench insulator 45 corresponding to the 2nd portion of 1st insulator 45 in memory cells of the present invention and can be a thermally grown oxide or a HTO oxide with thickness on the order of about 80 to 200 angstrom. In the same step, the liner oxide can also be formed atop the insulator oxide 30. The structure is further processed with a polysilicon layer 19 formed over the liner oxide 28. The deposition and formation of the polysilicon layer 19 on the liner oxide layer 28 can be made by a well known process such as Low Pressure CVD or LPCVD. The polysilicon layer 19 can be doped by an optional ion implantation or in-Situ. The thickness of the polysilicon layer 19 is chosen to completely fill the trench opening 32, and can range from 400 to 2000 angstroms, depending on the dimension of trench opening 32 and the level of scaling. The resulted structure is shown in FIGS. 6C through 9C.

The polysilicon 19 is then selectively removed to leave polysilicon 19 in region within or adjacent to the trenches 32. The preferable structure is with the polysilicon top surface 19a thereof exposed substantially co-planar with the liner oxide 28 atop the insulator oxide 30. This can be done by, for example, employing a chemical-mechanical polishing (CMP) process to planarize the poly followed by an RIE (reactive ion etch) using oxide blocks formed by layers 28 and 30 as an etching stopper. An optional polysilicon over-etch step follows if necessary to clear any polysilicon residue on the liner oxide 28. Thereby, the process leaves polysilicon 19 only in trenches 32 to form blocks of polysilicon self-aligned to the trench openings 32b. Non-self-aligned technique, such as patterning the polysilicon 19 by applying a photo-resist mask followed by a polysilicon etch, can be employed as well for the same purpose. The self-align technique is preferred for the reason that it offers advantage on achieving smaller cell size. The polysilicon regions formed within the trenches 32 are used as the floating gate 20 of the memory cell. The resulted structure is shown in FIGS. 6D through 9D.

The process is continued by forming high quality oxide regions 29 (with thickness on the order of 50 to 200 angstroms) atop of the floating gate polysilicon 20. The oxide is preferably a thermally grown oxide, which forms oxide regions 29 on the exposed polysilicon regions 20. Oxide regions 29 join with oxide layer 28 in forming an insulation layer that is disposed laterally adjacent to and over the polysilicon regions 20. Other options on forming high quality oxide such as HTO can be employed as well through conventional deposition technique. Thereafter, a polysilicon layer 14 (e.g. ~1000 to 2000 Å) is formed over the entire structure by conventional technique (e.g. LPCVD). Preferably, the polysilicon 14 is heavily doped with a p-type impurity (e.g. boron) by well-known ion implantation technique or by in-Situ doping technique. An optional insulator layer 35 (e.g. ~40–100 Å) is then formed over polysilicon layer 14. The resulted structure is shown in FIGS. 6E through 9E.

Photo-resist is applied on the structure and a masking step is performed to selectively remove the photo-resist from certain regions leaving a plurality of photo-resist stripes oriented in a second direction (i.e. the X or row direction). Where the photo-resist material is removed, the insulator layer 35, and the underlying polysilicon layer 14 are etched away in stripes 18a formed in the X or row direction, as shown in FIG. 6F, using standard etching techniques (i.e. anisotropic etch processes). Where the photo resist is not removed, the insulator layer 35, and the underlying polysilicon layer 14 are maintained. The remained portion of the polysilicon layer 14 forms a plurality of the control gate line traces 18. The width of the traces and the distance between adjacent traces 18 can be as small as the smallest lithographic feature of the process used. The remaining photo-resist is then removed using conventional means. The resulting structure is collectively illustrated in FIG. 6F through 9F, wherein the control gate line traces 18 are shown interlaced with the stripes 18a.

A relatively thick (~1500 Å) fourth insulating material 12 (preferably nitride) is formed over the structure and a masking step is performed to selectively remove the photo-resist from certain regions leaving a plurality of photo-resist stripes oriented in the first direction (i.e. the Y or column direction). Where the photo-resist material is removed, the insulator layer 12 and the underlying insulator layer 35 are etched away to form a semi-recessed trench stripes 11a oriented in the Y or column direction, as shown in FIG. 6G, using standard etching techniques (i.e. anisotropic etch processes). Where the photo resist is not removed, the fourth insulating material 12, and the underlying insulator layer 35 are maintained. The remained portion of the nitride insulator layer 12 forms a plurality of the nitride line traces 11. The width of the traces 11 and the distance between adjacent traces can be as small as the smallest lithographic feature of the process used. The remaining photo-resist is then removed using conventional means. The resulting structure is collectively illustrated in FIG. 6G through 9G, wherein the nitride line traces 11 are shown interlaced with the trench stripes 11a.

The process is continued by applying an optional polysilicon etch to the structure using standard etching technique (i.e. anisotropic etch processes). For the control gate polysilicon traces 18, this optional anisotropic etch process etches away a portion of the top surface of polysilicon layer 18, but leaves a taper shape or a concave shape in that top surface in the area next to the remaining nitride traces 11. Thereby, the polysilicon traces 18 exposed in the semi-recessed trench 11a forms the second portion 17 of the control gate polysilicon 18, whereas the polysilicon 18 under the nitride traces 11 forms the first portion 16 of the control gate polysilicon 18. The control gate polysilicon traces 18 are thus formed with the first 16 and the second 17 portions connected thereto. Thereby, the control gate traces 18 continuously extend across the isolation regions 5 and active regions 4, linking together one memory cell from each of the active regions 4.

Thereafter, a relatively thin (~40–100 Å) insulator layer 34 is then formed over the exposed polysilicon line traces 18. In a preferred embodiment, the insulator 14 is preferably an oxynitride layer with fractional oxide approximately equal to 82%. This can be done by, for example, a thermal oxidation step followed by a thermal nitridation using well known technique such as Remote-Plasma-Nitridation to form insulator 34 encapsulating any exposed portions of polysilicon 17. Insulator regions 34 join with insulator layer 35 in forming an insulation layer that is disposed over the polysilicon regions 18. The resulting structure is collectively illustrated in FIG. 6H through 9H.

The structure is further processed with a polysilicon layer 8 formed atop the structure. The deposition and formation of the polysilicon layer 8 can be made by a well known process such as Low Pressure CVD or LPCVD. The polysilicon layer 8 can be doped by an optional ion implantation or in-Situ. The thickness of the polysilicon layer 8 is chosen to completely fill the semi-recessed trench opening 11a, and can range from 400 to 2000 angstroms, depending on the dimension of trench opening 11a and the level of scaling. The polysilicon 8 is then planarized and etched back with polysilicon surface 8a formed preferably flush with the surface of the insulator nitride 11. This can be done by preferably employing a chemical-mechanical polishing (CMP) process to planarize the poly followed by an RIE (reactive ion etch) using nitride blocks 11 as an etching stopper. An optional polysilicon over-etch step follows if necessary to clear any polysilicon residue on nitride 11. Thereby, the process leaves polysilicon 8 only in the trenches 11a to form polysilicon traces 9 oriented in the first direction. The polysilicon traces 9 thus formed link together the tunneling gates 10 of memory cells on the same column. The resulted structure is shown in FIGS. 6I through 9I.

The structure is further processed by forming a self-aligned silicide on the exposed polysilicon traces 9 using conventional silicide technique. For example, a metal deposition step is performed, to deposit a metal (e.g. tungsten, cobalt, titanium, nickel, platinum, or molybdenum) over the structure, which is then annealed to permit the hot metal to flow and to seep into the exposed top portions of the polysilicon traces 9 to form a conductive layer of metalized silicon 38 (silicide). Metalized silicon regions 38 can be called self aligned silicide (i.e. salicide) as well, because they are self aligned to the polysilicon traces 9 and any other regions where silicon is exposed (e.g. in the region where logic transistors reside). The rest of the metal deposited on the remaining structure (e.g. on top the nitride stripes 11) is removed by a metal etch process, to result in the structure shown in FIGS. 6J through 9J.

The structure is then processed by following conventional backend process steps. These steps include, for example, forming an insulating material (e.g. BP TEOS) to cover the structure, followed by a contact masking step to define contact openings to make proper electrical connections to the electrodes in a memory array. The contact openings are then filled with conductor metal contacts by metal deposition, planarization, and etch-back. Finally, metal lines are formed to connect contacts followed by forming a passivation and bonding pads atop the structure.

It is to be understood that the present invention is not limited to the illustrated herein and embodiments described above, but encompasses any and all variations falling within the scope of the appended claims. For example, although the foregoing method describes the use of appropriately doped polysilicon as the conductive material used to form the memory cell tunneling gates and control gates, it should be apparent to those having ordinary skill in the art that any appropriate conductive material can be used. Therefore, as used in the claims, the terms "conductive materials" encompasses all such conductive materials such as polysilicon, polycide, aluminum, molybdenum, copper, titanium nitride, tantalum nitride etc). In addition, any appropriate insulator such as aluminum oxide, hafnium oxide, zirconium nitride, tantalum pen-oxide, etc, can be used in place of oxide, oxynitride or nitride. Moreover, any appropriate material whose etch property differs from oxide (or any insulator) and from polysilicon (or any conductor) can be used in place of nitride. Further, as is apparent from the claims, not all method steps need be performed in the exact order illustrated or presented in the claims, but rather in any order that allows the proper formation of the memory cells of the present invention. The control gate lines, tunneling gate lines, drain lines, and buried source lines need not have a continuous width or shape, need not be straight, need not be in rectangular shape in their cross-section, but rather can be any size and shape that effectively connects to each memory cell in the appropriate memory cell row or column. The floating gates need not be in rectangular shape in their cross-section, need not be in circular shape in their top view, but rather can be any size and shape in their cross-section and their top view that effectively store charges and effectively connects the drain and source regions in each memory cell. Furthermore, the top surface portion of the floating gate need not be co-planar with the substrate surface, but rather can be at any level under or above the substrate surface that effectively store charges, effectively capacitive-coupled with the control gate, and effectively connects the drain and source regions in each memory cell. Additionally, the bottom surface portion of the floating gate need not be within the buried source region, but rather can be within the substrate that effectively store charges, effectively capacitive-coupled with the control gate, and effectively connects the drain and source regions in each memory cell. Moreover, source and drain regions, and/or buried source and drain lines, can be swapped. It should be understood that while the figures show the substrate uniformly doped, it is well known that any and/or all of the regions formed therein (source, drain, channel region, well region 40, etc.) can be formed in one or more well regions (of differently doped silicon). Furthermore, the tunneling insulator, the retention insulator, and the trench insulator need not to be made of oxide, oxynitride, or nitride, but rather can be made of any appropriate insulator such as aluminum oxide, hafnium oxide, zirconium oxide, tantalum pen-oxide, etc, or can be made of the composite layers of these materials, e.g. oxide layer with and aluminum oxide layer or with zirconium oxide layer or other layers etc. Finally, the isolation regions need not have a continuous width or shape, need not be straight, need not be formed by field-oxide (STI or LOCOS), need not be formed by junction-separation technique, but rather can be any isolation scheme that effectively divides active regions of memory cells in the appropriate memory column.

What is claimed is:

1. An electrically erasable and programmable read only memory device comprising:
   a bulk material;
   a first layer of semiconductor material over said bulk material and having a first conductivity type;
   a first region formed in between said bulk material and said first layer, and having a second conductivity type;
   a trench formed into a surface of said first layer and having a sidewall and a bottom;
   a second region formed in said first layer, laterally adjacent to an upper portion of said trench, and having the second conductivity type;
   a channel region in said first between said first region and said second region, and extending generally along said sidewall of said trench;
   an electrically conductive floating gate disposed adjacent to and insulated from said channel region;
   an electrically conductive control gate having at least a portion thereof disposed over and insulated from said floating gate; and
   an electrically conductive tunneling gate disposed over and insulated from at least a portion of said control gate.

2. The device of claim 1, wherein said bulk material includes a semiconductor material having the first conductivity type.

3. The device of claim 1, wherein said bulk material includes an insulator.

4. The device of claim 1, wherein at least a portion of said floating gate is disposed laterally adjacent to said channel region.

5. The device of claim 1, wherein a portion of said floating gate is disposed adjacent to and insulated from a portion of said first region.

6. The device of claim 1, wherein:
   said sidewall if said trench is generally perpendicular to a surface of said first layer; and
   said bottom of said trench is generally parallel to said surface of said first layer.

7. The device of claim 1, wherein said trench extends through said second region, said first layer with said bottom formed within said first region.

8. The device of claim 1, wherein said trench extends through said second region, said first layer and said first region with said bottom formed within said bulk material.

9. The device of claim 1, wherein said floating gate includes:

a first portion disposed laterally adjacent to and insulated from said sidewall of said trench; and a second portion disposed over and insulated from said bottom of said trench.

10. The device of claim 1, wherein said floating gate includes:

a first portion disposed over and insulated from at least a portion of said second region;

a second portion disposed laterally adjacent to and insulated from said sidewall of said trench; and a third portion disposed over and insulated from said bottom of said trench.

11. The device of claim 1, further comprising a first insulating layer having a first portion disposed over said second region and a surface of said first layer, and a second portion disposed over said bottom and laterally adjacent to said sidewall of said trench.

12. The device of claim 1, wherein:

said control gate and said tunneling gate overlap with each other at an overlapping region; and at least a portion of said floating gate is disposed under the overlapping region.

13. The device of claim 9, wherein said floating gate has a generally rectangular shaped structure.

14. The device of claim 9, wherein said floating gate has a generally "V" shaped structure.

15. The device of claim 10, wherein said floating gate has a generally "T" shaped structure.

16. The device of claim 1, wherein said control gate includes:

a first portion disposed generally over and insulated from at least a portion of said second region and a surface of said first layer; and a second portion disposed generally over and insulated from a surface of said floating gate.

17. The device of claim 1, wherein a portion of said control gate has a thickness permitting ballistic charges transport therethrough.

18. The device of claim 16, wherein said second portion of said control gate is generally thinner than said first portion.

19. The device of claim 16, wherein said second portion of said control gate has generally a concave shaped structure.

20. The device of claim 16, wherein said second portion of said control gate has generally a convex shaped structure.

21. The device of claim 16, wherein said second portion of said control gate has generally a semi-recessed trench shaped structure.

22. The device of claim 16, further comprising an insulating layer between said tunneling gate and said control gate, said insulating layer having a thickness permitting quantum mechanical tunneling of charges therethrough.

23. The device of claim 22, wherein said insulating layer is a silicon oxynitride layer having a fractional oxide in the range between about 70% and about 90%.

24. The device of claim 22, wherein said insulating layer includes:

a first portion generally disposed over said first portion of said control gate region; and a second portion generally disposed over the entire second portion of said control gate region.

25. The device of claim 22, wherein the quantum mechanical tunneling is the Fowler-Nordheim tunneling.

26. The device of claim 22, wherein the quantum mechanical tunneling is the direct-tunneling mechanism.

27. The device of claim 24, wherein said second portion of insulating layer is a silicon oxynitride layer having a fractional oxide in the range between about 70% and about 90%.

28. The device of claim 1, wherein said control gate is heavily doped p-type semiconductor material.

29. The device of claim 1, wherein said tunneling gate is a heavily doped p-type semiconductor material.

30. The device of claim 22, wherein said control gate is a metal having a work function with the Fermi-level lies generally in the middle of the energy band gap of said insulating layer.

31. The device of claim 22, wherein the tunneling gate is a metal having a work function with a Fermi-level lies generally in the middle of the energy band gap of the insulating layer.

32. An array of electrically programmable and erasable memory devices comprising:

a bulk material;

a first layer of semiconductor material over said bulk material and having a first conductivity type;

spaced apart isolation regions formed in said first layer which are generally parallel to one another and extend in a first direction, with an active region between each pair of adjacent isolation regions;

spaced apart drain-lines extend in said first direction with each of said drain-line formed in at least a portion of said active region and next to the surface of said first layer;

each of said active regions including a plurality of memory cells, each of the memory cells comprising:

a first region formed in between said bulk material and said first layer, and having a second conductivity type;

a trench formed into a surface of said first layer and having a sidewall and a bottom;

a second region formed in said first layer, laterally adjacent to an upper portion of said trench, and having the second conductivity type;

a channel region in said first layer between said first region and said second region, and extending generally along said sidewall of said trench;

an electrically conductive floating gate disposed adjacent to and insulated from said channel region;

an electrically conductive control gate having at least a portion thereof disposed over and insulated from said floating gate; and an electrically conductive tunneling gate disposed over and insulated from at least a portion of said control gate.

33. The array of device of claim 32, wherein said bulk material is a semiconductor material having the first conductivity type.

34. The array of devices of claim 32, further comprising:

a plurality of said trenches arranged in an array of columns extending in the first direction and rows in a second direction generally perpendicular to the first direction.

35. The array of devices of claim 34, wherein each column of said trenches is generally centered to one of said drain-lines.

36. The array of devices of claim 32, further comprising:

a plurality of parallel spaced apart control gate lines of conductive material each extending across said active regions and isolation regions is a second direction generally perpendicular to the first direction; wherein each of the control gate lines is electrically connected to some of said control gates of said memory devices.

37. The array of devices of claim 32, further comprising:
a plurality of parallel spaced apart tunneling line blocks of conductive material each extending in the first direction and electrically connected to some of said tunneling gates of said memory devices.

38. The array of devices of claim 32, wherein for each of the memory cells:
said control gate and said tunneling gate overlap with each other at an overlapping region; and
at least a portion of said floating gate is disposed under the overlapping region.

39. The array of devices of claim 32, wherein for each of the memory cells, said second region is electrically connected to at least a portion of one of said drain-lines.

40. The array of devices of claim 32, further comprising:
a plurality of parallel spaced apart source lines of conductive material each electrically connected to some of said first regions of said memory devices.

41. The array of devices of claim 32, wherein for each of the memory cells, said trench extends through said second region and said first region and said first layer with said bottom formed within said first region.

42. The array of devices of claim 32, wherein for each of the memory cells, said trench extends through said second region, said first layer, and said first region, with said bottom formed within said bulk material.

43. The array of devices of claim 32, wherein each of said floating gate includes:
a first portion disposed laterally adjacent to and insulated from said sidewall of one of said trenches; and
a second portion disposed over and insulated from said bottom of said one trench.

44. The array of devices of claim 32, wherein each of said floating gates includes:
a first portion disposed over and insulated from at least a portion of one of said second regions;
a second portion disposed laterally adjacent to and insulated from said sidewall of one of said trenches; and
a third portion disposed over and insulated from said bottom of said one trench.

45. The array of devices of claim 43, wherein each of the floating gate regions has a generally rectangular shaped structure.

46. The array of devices of claim 43, wherein each of said floating gates has a generally truncated "V" shaped structure.

47. The array of devices of claim 44, wherein each of said floating gate regions has a generally "T" shaped structure.

48. The array of devices of claims 32, wherein for each of said memory cells, a portion of said control gate has a thickness permitting ballistic charges transport therethrough.

49. The array of devices of claim 32, wherein for each of said memory cells, said control gate includes:
a first portion disposed generally over and insulated from at least a portion of said second region and a surface of said first layer; and
a second portion disposed generally over and insulated from a surface of said floating gate, and having a thickness permitting ballistic charges transport therethrough.

50. The array of devices of claim 49, wherein for each of said control gates, said second portion is generally thinner than said first portion.

51. The array of devices of claim 49, wherein each of said second portions of said control gates has generally a concave shaped structure.

52. The array of devices of claim 49, wherein each of said second portions of said control gates has generally a convex shaped structure.

53. The array of devices of claim 49, wherein each of said second portions of said control gates has generally a semi-recessed trench shaped structure.

54. The array of devices of claim 49, wherein each of said memory cells further comprising an insulating layer between said tunneling gate and said control gate, said insulating layer having a thickness permitting quantum mechanical tunneling of charges therethrough.

55. The array of devices of claim 54, wherein said insulating layer is a silicon oxynitride layer having a fractional oxide in the range between about 70% and about 90%.

56. The array of devices of claim 54, wherein for each of the memory cells, said insulating layer includes:
a first portion disposed generally over said first portion of said control gate; and
a second portion disposed generally over said second portion of said control gate.

57. The array of devices of claim 54, wherein the quantum mechanical tunneling is the Fowler-Nordheim tunneling.

58. The array of devices of claim 54, wherein the quantum mechanical tunneling is the direct-tunneling mechanism.

59. The array of devices of claim 56, wherein for each of said memory cells, said second portion of said insulating layer is a silicon oxynitride layer having a fractional oxide in the range between about 70% and about 90%.

60. The array of devices of claim 32, wherein each of said control gates is a heavily doped p-type semiconductor material.

61. The array of devices of claim 32, wherein each of said tunneling gates is a heavily doped p-type semiconductor material.

62. The array of devices of claim 54, wherein each of said control gates is a metal having a work function with the Fermi-level lies generally in the middle of the energy band gap of said insulating layer.

63. The array of devices of claim 54, wherein each of said tunneling gates is a metal having a work function with the Fermi-level lies generally in the middle of the energy band gap of said insulating layer.

64. The array of devices of claim 32, wherein each of said isolation regions has a block of insulator.

* * * * *